US008806405B2

(12) United States Patent
Colwell et al.

(10) Patent No.: US 8,806,405 B2
(45) Date of Patent: Aug. 12, 2014

(54) PRODUCING A NET TOPOLOGY PATTERN AS A CONSTRAINT UPON ROUTING OF SIGNAL PATHS IN AN INTEGRATED CIRCUIT DESIGN

(71) Applicant: Cadence Design Systems, Inc., San Jose, CA (US)

(72) Inventors: Regis Colwell, Gibsonia, PA (US); Arnold Ginetti, Antibes (FR); Khalid ElGalaind, Allison Park, PA (US); Thomas Jordan, Pittsburgh, PA (US); Jose A. Martinez, Pittsburgh, PA (US); Jeffrey Markham, San Jose, CA (US); Steven Riley, San Jose, CA (US); Chung-Do Yang, Saratoga, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 13/665,760

(22) Filed: Oct. 31, 2012

(65) Prior Publication Data
US 2014/0123094 A1    May 1, 2014

(51) Int. Cl.
*G06F 17/50* (2006.01)

(52) U.S. Cl.
USPC .......... 716/126; 716/101; 716/102; 716/110; 716/139

(58) Field of Classification Search
CPC ............ G06F 17/5045; G06F 17/5068; G06F 17/5072; G06F 17/5081; G06F 17/509; G06F 2217/04
USPC ................... 716/55, 101, 102, 110, 126, 139
See application file for complete search history.

(56) References Cited

U.S. PATENT DOCUMENTS

| | | | |
|---|---|---|---|
| 6,173,433 B1 * | 1/2001 | Katoh et al. ................. 716/122 |
| 6,425,115 B1 * | 7/2002 | Risler et al. ................. 716/114 |
| 7,263,680 B2 * | 8/2007 | Drapeau ....................... 716/126 |
| 7,299,438 B2 * | 11/2007 | Hosono ........................ 716/113 |
| 7,835,888 B2 * | 11/2010 | Inoue et al. .................. 702/194 |
| 2005/0268258 A1 * | 12/2005 | Decker ............................ 716/4 |
| 2006/0101368 A1 * | 5/2006 | Kesarwani et al. ............ 716/11 |
| 2006/0109032 A1 * | 5/2006 | Hosono ........................... 327/41 |
| 2007/0250800 A1 * | 10/2007 | Keswick .......................... 716/8 |
| 2008/0052653 A1 * | 2/2008 | Tuncer et al. .................... 716/6 |
| 2008/0104562 A1 * | 5/2008 | Ichinose ........................... 716/6 |
| 2010/0242007 A1 * | 9/2010 | Yoda ................................. 716/6 |
| 2011/0082657 A1 * | 4/2011 | Ito .................................. 702/79 |

* cited by examiner

*Primary Examiner* — Thuan Do
*Assistant Examiner* — Brian Ngo
(74) *Attorney, Agent, or Firm* — Kenyon & Kenyon LLP

(57) ABSTRACT

A method is provided to produce a constraint information for use to implement a routing process used to generate routing signal lines in an integrated circuit design comprising: producing a net topology pattern structure that corresponds to a logical net that is associated with at least two instance item structures of at least one functional design, wherein the net topology pattern structure is associated with the at least two instance item structures and includes multiple constituent structures that indicate at least one constraint upon physical implementation of the logical net structure.

41 Claims, 22 Drawing Sheets

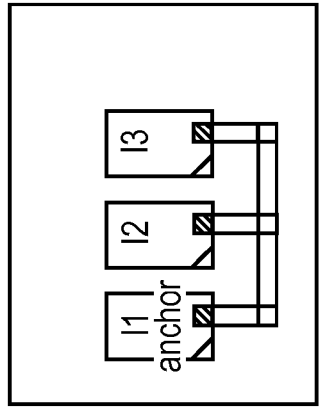
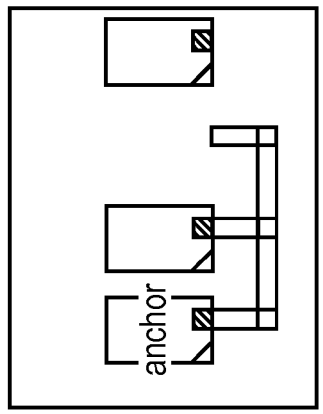
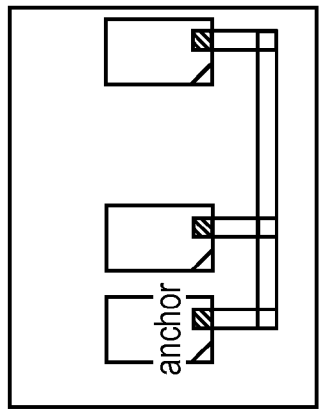
FIG. 8
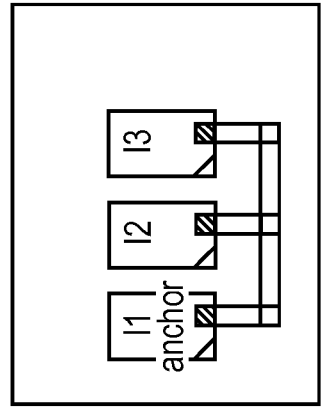
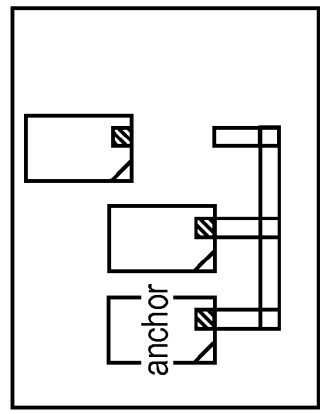
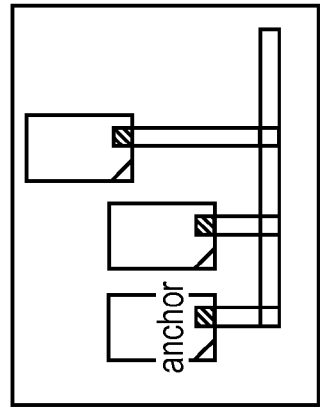
FIG. 9

Trunk Pattern Tr1:
   Twig Patterns: Tw1, Tw2
   Anchor: Instance I1;
   Side: Bottom;
   Trunk Connection Pattern: Tc1

Trunk Pattern Tr2:
   Twig Patterns: T8, T9
   Anchor: Trunk Pattern Tr1;
   Side: Bottom;
   Trunk Connection Pattern: Tc2

Trunk Pattern Tr3:
   Twig Patterns: Tw3, Tw4, Tw5;
   Anchor: Instance I3;
   Side: Bottom;
   Trunk Connection Patterns: Tc2, Tc3

Trunk Pattern Tr4:
   Twig Patterns: Tw10, Tw11, Tw12;
   Anchor: Trunk Pattern Tr3;
   Side: Bottom;
   Trunk Connection Patterns: Tc1, Tc4

Trunk Pattern Tr5:
   Twig Patterns: Tw6, Tw7;
   Anchor: Instance I6;
   Side: Bottom;
   Trunk Connection Pattern: Tc4

Trunk Pattern Tr6:
   Twig Patterns: T13, T14;
   Anchor: Trunk Pattern Tr5;
   Side: Bottom;
   Trunk Connection Pattern: Tc3

PRODUCING A NET TOPOLOGY PATTERN AS A CONSTRAINT UPON ROUTING OF SIGNAL PATHS IN AN INTEGRATED CIRCUIT DESIGN

BACKGROUND

During a routing stage of the design of an integrated circuit (IC), signal paths are defined that connect circuit components. Routing requirements can vary for different designs and from user to user, from company to company or even among a relatively small team of users. Varying requirements can arise, for example, due to differences in circuit type, design node, performance, expected operating conditions, experience, conventions, or even aesthetics of the routing. Routing requirements can be especially important for analog circuit designs which often require connection paths that have an exact physical pattern or shape to achieve desired performance. One design team may chose to never place routing over an area which contains a circuit component due to interference concerns while another team is more concerned with chip area and always places routing over devices, for example.

Typically, routing occurs later in the circuit design process, after logical design, simulation and physical placement. However, capturing information concerning special routing requirements for portions of a design earlier in the design flow can be beneficial. For example, knowing a desired routing pattern prior to creating the geometry to realize that pattern can be useful in circuit simulation or even designing other parts of the circuit. For example, physical distances between certain circuit components may affect the performance of these components. Knowing routing constraints earlier in the design process can be used to evaluate expected distances between the components before their physical geometries and placements are determined, which can be used to select components to minimize unwanted effects while satisfying routing requirements. A class of these effects, known as layout dependent effects, which often involve parasitic effects between circuit components, have become more important with shrinking device sizes in VLSI designs.

SUMMARY

In one aspect, a method is provided to produce constraint information for use in generating routing signal lines in an integrated circuit design. The method involves producing a net topology pattern structure stored in computer memory that corresponds to a logical net that is associated in the memory with at least two instance item structures that are part of a functional design structure stored in the memory. The net topology pattern structure is associated in the memory with the at least two instance item structures and includes multiple constituent structures that indicate at least one constraint upon physical implementation of the logical net structure.

In another aspect, a method involving the use of a graphical display is provided to produce constraint information for use in generating routing signal lines in an integrated circuit design. Multiple constituent graphical display objects are assembled on a computer display screen to produce a graphical net topology pattern display that represents a logical net that is associated within computer memory with at least two instance item structures of a functional design structure stored in the memory. The net topology pattern display shows connections between one or more of its constituent graphical display objects and at least two instance item display objects shown on the display screen that represent the at least two instance item structures stored in the memory. In response to the assembling of the topology pattern display on the display screen, a net topology pattern structure is produced and stored in the memory that is associated in the memory with the at least two instance item structures and that includes multiple constituent structures that indicate at least one constraint upon physical implementation of the logical net structure.

These and other features and advantages of the invention will be appreciated from the following illustrative drawings.

BRIEF DESCRIPTION OF THE DRAWINGS

FIG. 8 is an illustrative drawing showing a succession of three screen displays showing adjustment of a trunk display object to movement of an instance item in the design in accordance with some embodiments.

FIG. 9 is an illustrative drawing showing a succession of three screen displays showing adjustment of a twig display object to movement of an instance item in the design in accordance with some embodiments.

FIG. 19 is an illustrative drawing showing net pattern attribute information for the display objects that are constituents of the net topology pattern display of FIG. 18.

DESCRIPTION OF EMBODIMENTS

Figure 1:
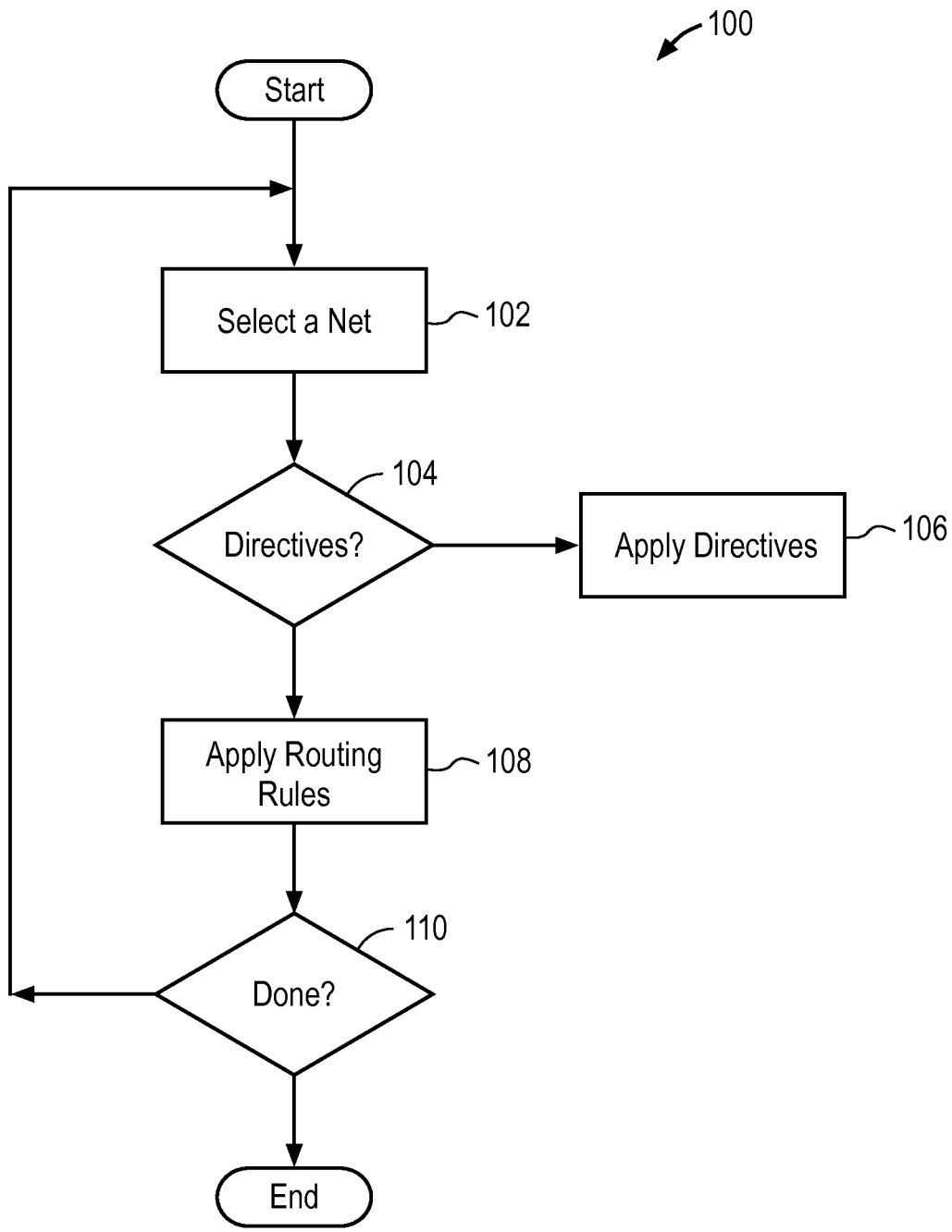
FIG. 1 is an illustrative flow diagram representing a process performed by a computer configured to route signal paths within an integrated circuit design in accordance with some embodiments.

The following description is presented to enable any person skilled in the art to create and use a method and system to produce a display of a net topology pattern and to generate a corresponding net topology structure in storage that can be used to guide routing of connection paths for signals within an integrated circuit design. Various modifications to the example embodiments herein will be readily apparent to those skilled in the art, and the principles defined herein may be applied to other embodiments and applications without departing from the spirit and scope of the present disclosure. Moreover, in the following description, numerous details are set forth for the purpose of explanation. However, one of ordinary skill in the art will realize that the present disclosure might be practiced without the use of these specific details. In other instances, well-known data structures and processes are shown in block diagram form in order not to obscure the description of the present disclosure with unnecessary detail. Identical reference numerals may be used to represent different views of the same item in different drawings. Flow diagrams in drawings referenced below are used to represent processes. A computer system is configured to perform these processes. The flow diagrams include modules that represent the configuration of a computer system according to computer program code to perform the acts described with reference to these modules. Thus, the present disclosure is not intended to be limited to the example embodiments shown herein, but is to be accorded the widest scope consistent with the principles and features disclosed herein.

During the process of designing an integrated circuit (IC), a circuit designer often uses software-based graphical circuit design tools to build schematic representations of circuit designs that include symbolic representations of logical components such as inverters and other logical gates and symbolic representations of more complex functional components such as adders or Phase Lock Loops (PLLs), for example. In a hierarchical design, the schematic representations of components at a more abstract higher level of a design hierarchy hide design details shown within corresponding schematic representations at less abstract lower levels of the design hierarchy. In a cell-based IC design, repetitive blocks of circuitry are represented by cells that may be accessed from a design cell library using the software tool. In a cell-based hierarchical IC design, cells disposed higher in an IC design hierarchy may contain instances of other cells lower in the hierarchy.

During the design of an IC, a schematic design may be converted to a layout design, which specifies the relative positions of the geometric structures used to implement the circuit elements such as transistors, resistors, capacitors and guard rings that correspond to components of the schematic design. Routing is a process of defining physical connection paths (e.g., metal connectors) to conduct signals among circuit elements and structures in a design. Routing typically is performed after physical placement of cells and circuit elements within a design has been determined. Routing typically is performed using a software based routing tool that configures a computer system in accordance with layout rules applicable to a particular design to determine physical geometric shapes, positioning and dimensions of routing signal connection paths among cells and circuit elements within a design. A channel-based router creates connections in a design between components (i.e. instance items, vias, guard ring) in an area between, alongside, or over (e.g., in a different layer) a set of components of the design. The region of the design where these connections are made is commonly referred to as a channel. Typically, the components are aligned and the channel is well defined. One style of routing used in channels is known as pin-to-trunk routing. In pin-to-trunk routing a central wire (trunk) is located in the channel, spanning its length. Small connections between the components and the trunk and are commonly referred to as twigs.

FIG. 1 is an illustrative flow diagram representing a process 100 performed by a computer configured to route signal paths within an integrated circuit design in accordance with some embodiments. A routing tool may configure the computer to implement the process. A routing tool typically applies routing rules applicable generally to a particular design topology to determine physical geometry of connection paths for signals within a design. Occasionally, however, a designer may wish to override these rules through directives to the routing tool as to the physical implementation of selected paths within a design. The process of FIG. 1 illustrates the use of user-created directives to override ordinary routing rules applied by a routing tool. In module 102, a net within the design is selected. Decision module 104 determines whether the net is associated with one or more directives. As used herein, a 'directive' associated with a net comprises guidance to the router to implement a net to which the directive applies in a particular manner with regard to positioning, dimensions and/or geometric shape, for example. As explained more fully below, in accordance with some embodiments, a directive may include one or more data structures that provide information in hierarchical form as to the positioning, dimensions and geometric shape(s) used to implement a net within a design. If decision module 104 determines that a directive applies to the selected net, then module 106 implements the directive to generate a connection path that complies with the positioning, dimensions and geometric shape requirements of the directive to implement the net within the design. If decision module 104 determines that no directive applies to the selected net, then module 108 applies the routing tool's general routing rules to determine positioning, dimensions and geometric shape of a connection path to implement the net in the design. Following module 106 or 108, whichever occurs, decision module 110 determines whether there are additional nets within the design to be routed. If yes, then control flows to module 102, and another net is selected. If no, the process ends.

Figure 2:
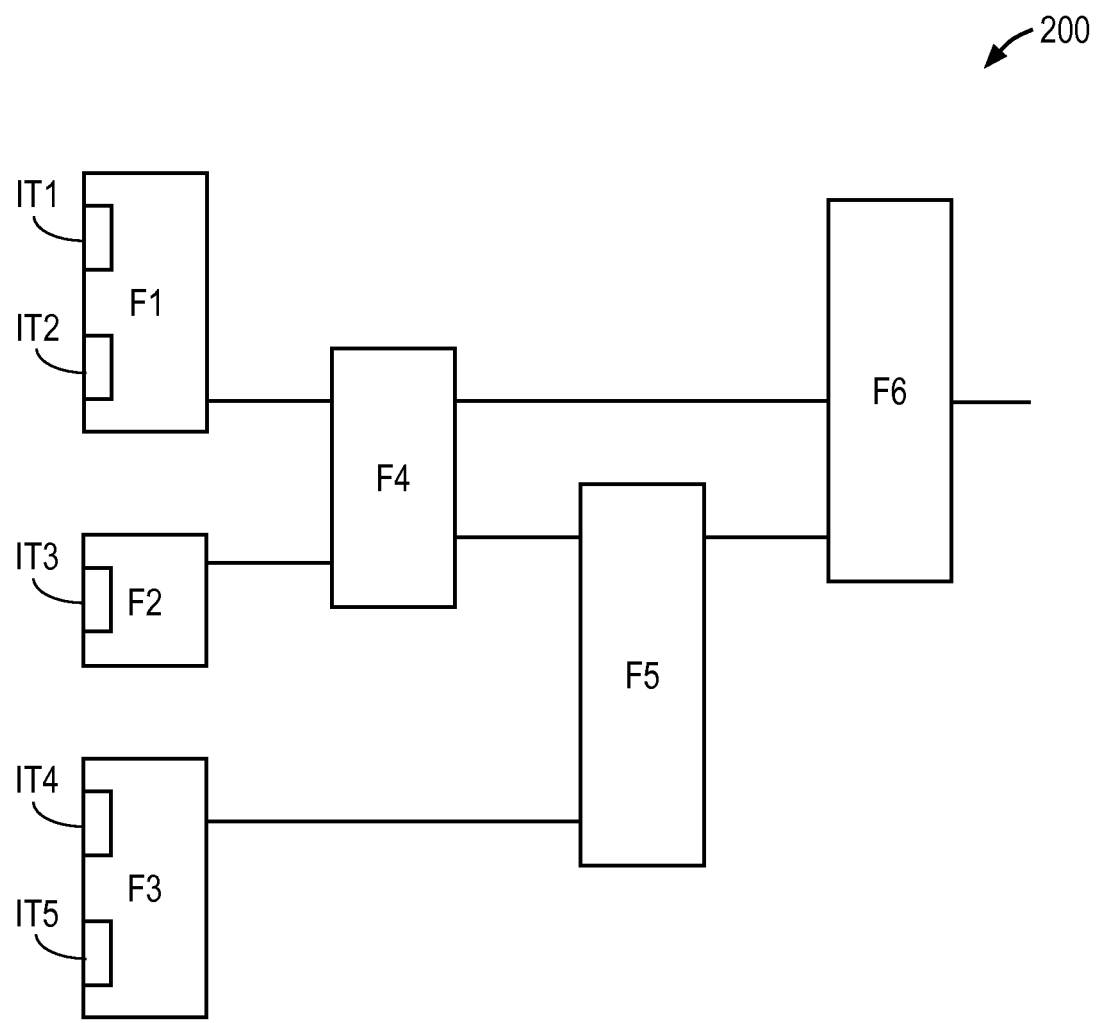
FIG. 2 is an illustrative block diagram level representation of an example functional circuit design structure.

FIG. 2 is an illustrative block diagram level representation of an example functional circuit design structure 200. As mentioned above, during a process of designing an IC, a circuit designer often uses software-based graphical circuit design tools to build schematic representations of functional components of a circuit design, which can be displayed on a computer screen. The illustrative functional circuit design includes functional blocks F1-F6. Details of the functional blocks are unimportant. The example functional design includes instance items IT1-IT5, which may be pins associated with functional blocks of the circuit design, for example.

A design team or design team member may wish to define a net topology pattern structure for a net that interconnects instances of a functional circuit design, such as that of FIG. 2 for example, before a physical placement phase of the circuit design process. In analog designs, for example, physical dimensions including relative physical dimensions and spacing of connection objects that are constituents of a physical implementation of a net may be important to achieving desired performance. A designer, therefore, may wish to create a net topology pattern early in the design process, e.g., prior to functional cell placement, to specify actual or relative physical dimension or spacing information for a net.

Furthermore, capturing information concerning physical implementation of routing of a net early in an integrated circuit design flow can be useful so that steps of the flow downstream can benefit. For example, knowing a routing pattern prior to creating geometry to realize that pattern could be useful in circuit simulation or even designing other parts of the circuit. For example, knowing distances between certain circuit components may affect the performance of these components which could be compensated for by changing the components before they are created. These effects sometimes referred to as layout dependent effects, such as parasitic effects, are becoming more prevalent as device sizes in VLSI circuit design dimensions shrink.

Figure 3A:
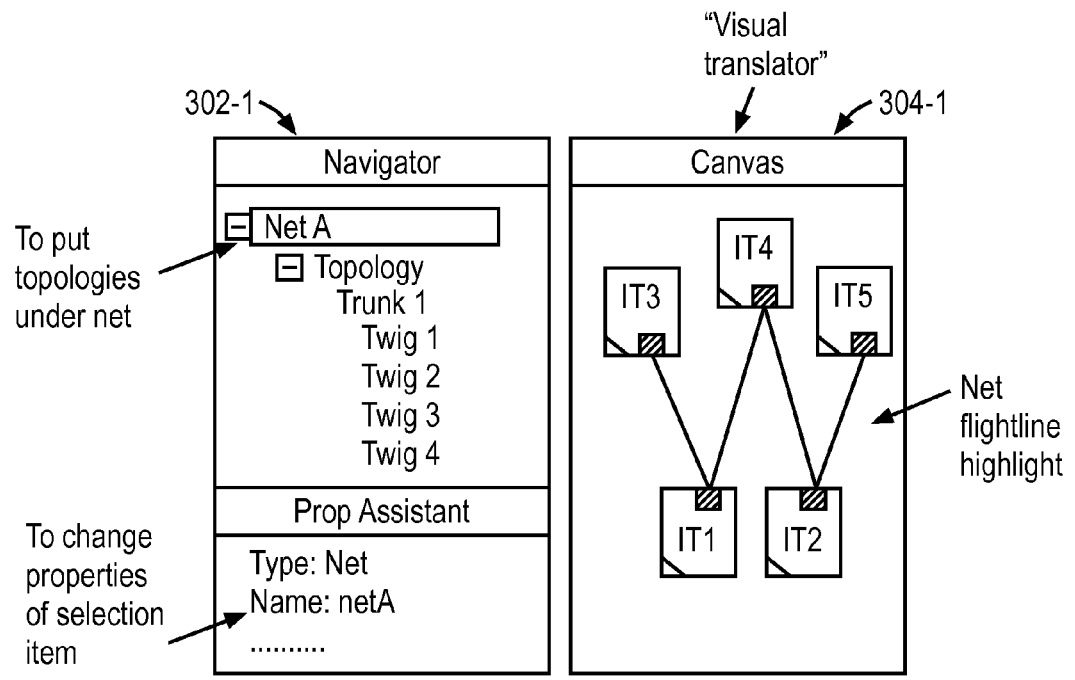
FIGS. 3A-3D are illustrative drawings showing different views of a user interface display screen used to create directives for use by a routing tool in accordance with some embodiments.
Figure 3B:
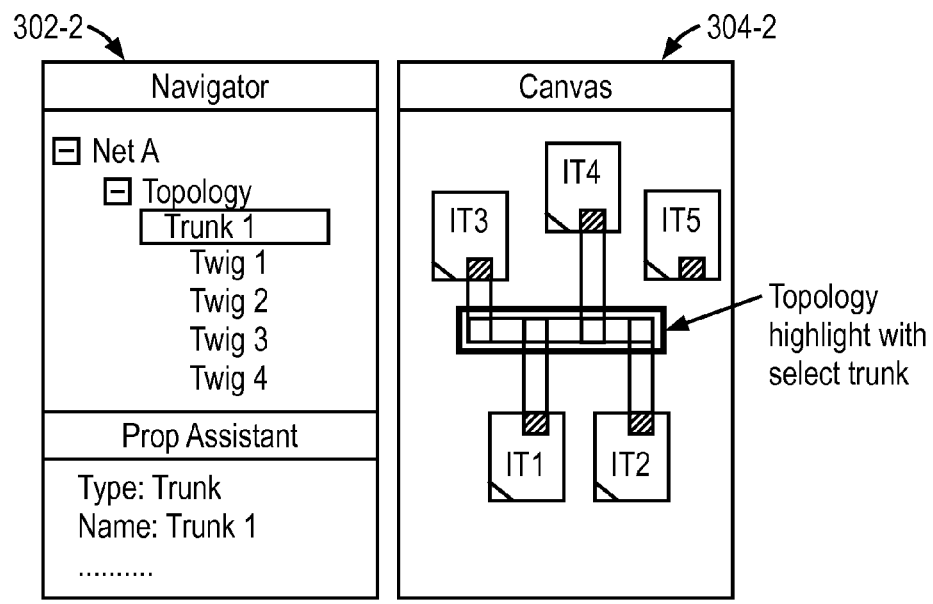
Figure 3C:
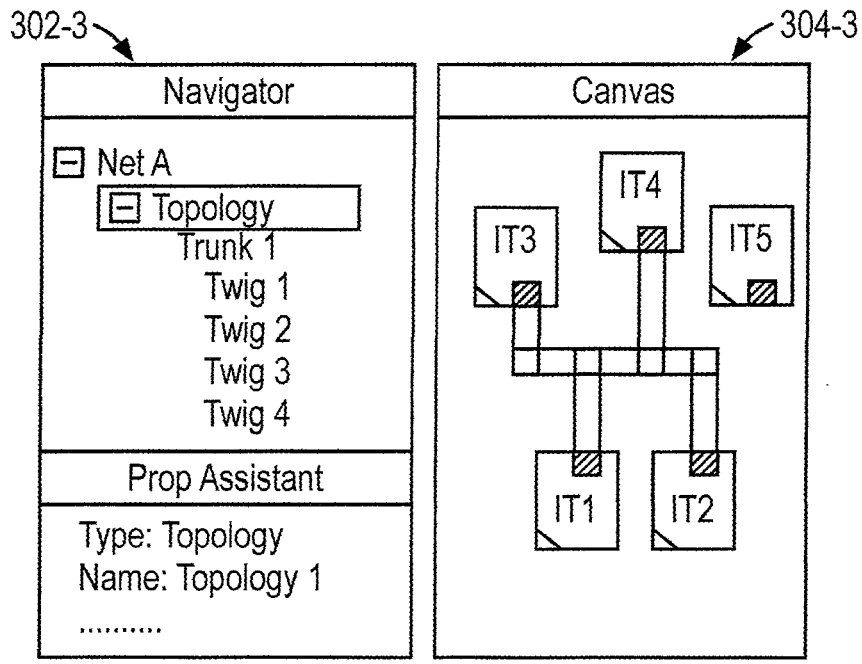
Figure 3D:
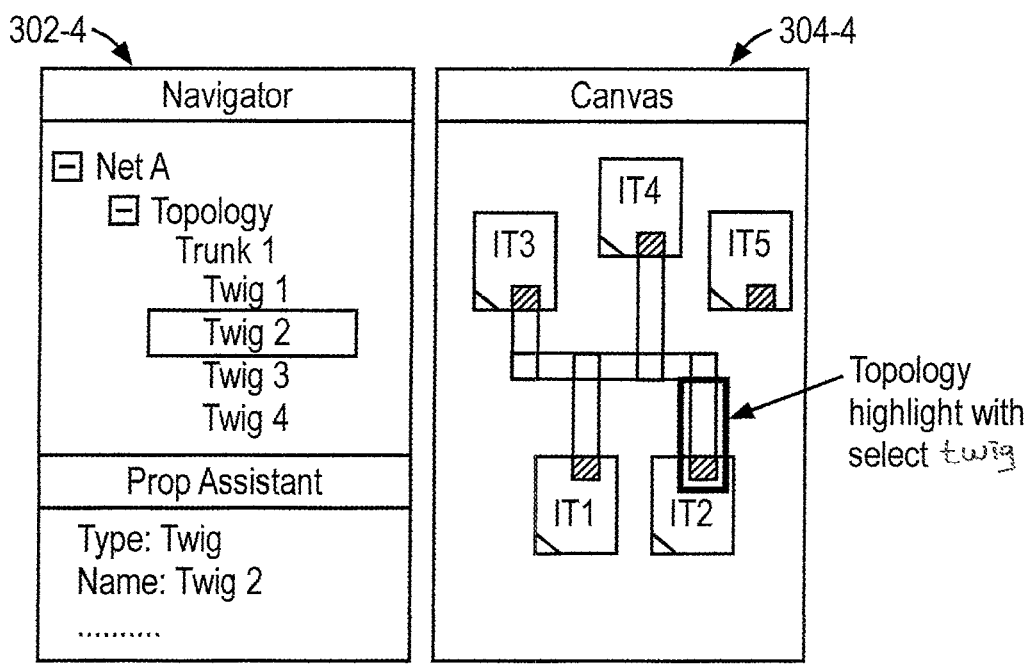

FIGS. 3A-3D are illustrative drawings showing different views of a user interface display screen used to create constraints that serve as directives for use by a routing tool in accordance with some embodiments. A navigator screen display 302 (left) shows a selection and attribute information corresponding to a net topology pattern shown on a canvas 304 (right) displayed on a computer screen in accordance with some embodiments. The canvas 304 display of FIG. 3A displays a collection of design instance items IT1-IT5 connected by a net topology pattern indicating that these instance items are logically coupled to a common net. As used herein, a 'net' is a point of interconnection within a design. As used herein, a 'logical net' comprises interconnections of a net without physical implementation details. The design instance items IT1-IT5, for example, may represent pins of one or more design cells (not shown) of an integrated circuit design (not shown). FIGS. 3B-3D show a net topology pattern representing physical implementation details of the net of FIG. 3A that interconnects the instance items IT1-IT5 together.

Each navigator screen displays includes a selection menu region and an attributes display and editing region. The selection menu region provides a scrollable hierarchical menu of selection items that matches the object patterns shown in the net topology pattern hierarchy displayed on the canvas. The attributes display and editing region is a scrollable region that provides attribute information about objects displayed on the canvas. In response to a user selection of a menu item in the selection menu region, a corresponding display object in the canvas is highlighted, and attributes of the highlighted display object are displayed within the attributes display and editing region. The user can enter information into the attributes display and editing region to edit attributes of a selected display object. Changing the attributes display object, for example, can change directives to a routing tool.

In FIG. 3A, "NetA" is selected in the selection menu region 302-1. The selected net is represented by a net display object referred to as a "flightline highlight", which is highlighted in the canvas 304-1. Information about NetA is displayed in the attributes display and editing region.

In FIG. 3B, a "Trunk 1" menu item is selected in the selection menu region 302-2. A trunk pattern display in a net topology pattern is highlighted in the canvas 304-2 that corresponds to the Trunk 1 selection. Information about Trunk 1 is displayed in the attributes display and editing region. The trunk pattern display represents a constraint that can be used as a directive by a router that guides the router in generating information for a physical structure corresponding to the trunk pattern display during routing to implement the logical net.

In FIG. 3C, a "Topology 1" menu item is selected in the selection menu region 302-3. The entire topology of a net topology pattern is highlighted in the canvas 304-3 that corresponds to the Topology 1 selection. Information about Topology 1 is displayed in the attributes display and editing region. The topology pattern display represents a constraint that can be used as a directive by a router that guides the router in generating information for a physical structure corresponding to the topology pattern display during routing to implement the logical net.

In FIG. 3D, "Twig 2" menu item is selected in the selection menu region 302-4. A twig pattern display in a net topology pattern is highlighted in the canvas 304-4 that corresponds to the Twig 2 selection. Information about Twig 2 is displayed in the attributes display and editing region.

Figure 4A:
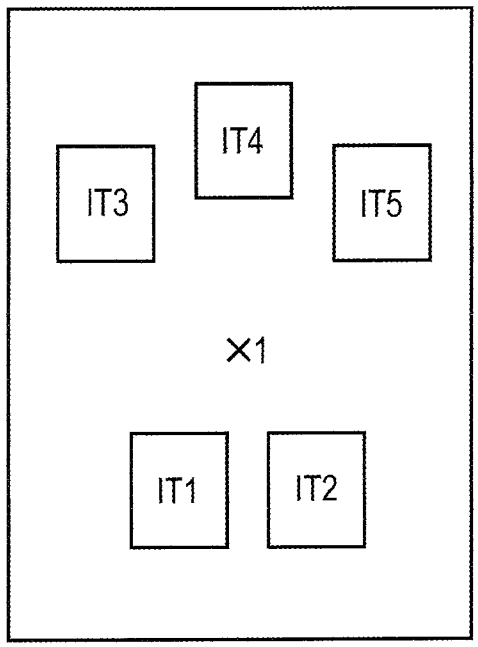
FIGS. 4A-4D are illustrative drawings showing an example sequence a canvas display showing user interface (UI) steps in creation of a portion of a net topology pattern in accordance with some embodiments.
Figure 4B:
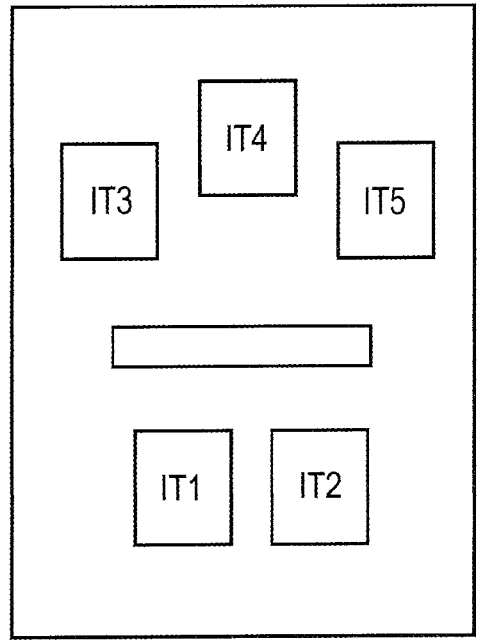
Figure 4C:
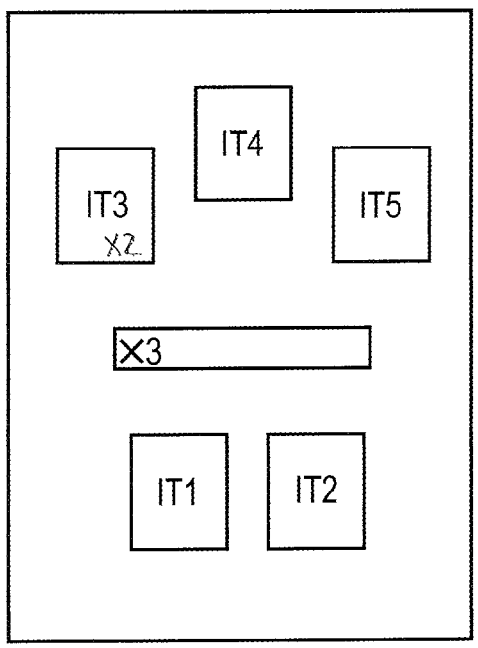
Figure 4D:
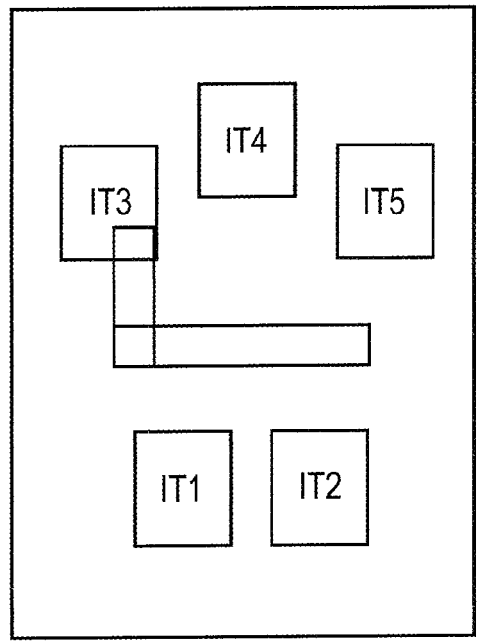

FIGS. 4A-4D are illustrative drawings showing an example sequence of canvas displays showing user interface (UI) steps in creation of a portion of a net topology pattern in accordance with some embodiments. In FIG. 4A, instance items IT1-IT5 are arranged in the display canvas and a user (not shown) uses a selection device such as a mouse or other pointing device (not shown) to select a location x1 in a channel between instance items. In FIG. 4B, the user uses the selection device to insert a trunk display object in the channel region at the selected location x1. In FIG. 4C, the user selects connection point locations x2, x3 on the trunk display object and on an instance item. In FIG. 4D, the user uses the selection device to insert a twig display object in the channel region to interconnect the selected location points x2, x3. Thus, it will be appreciated that complex net topology patterns can be built up through these techniques.

Figure 5:
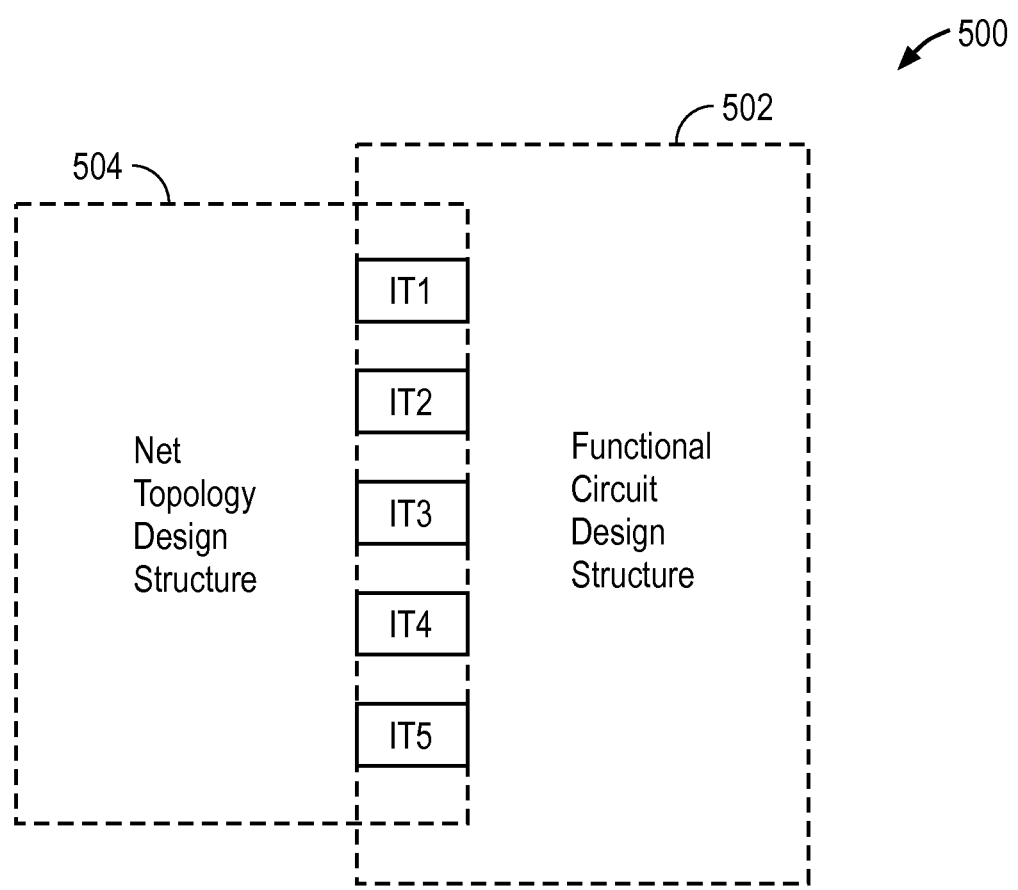
FIG. 5 is an illustrative drawing representing an example data structure that corresponds to the functional design of FIG. 2 and an example data structure that corresponds to the net topology display of FIGS. 3A-3D in accordance with some embodiments.

FIG. 5 is an illustrative drawing representing an example data structure 500 that includes the functional design structure 502 of FIG. 2 and a data structure 504 that corresponds to the net topology display of FIGS. 3A-3D in accordance with some embodiments. The functional design data structure 502 and the net topology pattern structure 504 share instance items IT1-IT5 and are stored together in a computer readable storage device using a common database framework. Shared data structures items can be used to adjust a net topology display to maintain a displayed connection with a shared instance item in response to a change in location or size of that instance item display resulting from a change made to the functional design that shares the instance item. In other words, a shared data structure item can be used to maintain continuity of connection between a net topology pattern display and a shared instance item display in spite of a designer's making a change to the functional design that alters that shared instance item display. In addition, shared data structure items can be used in accordance with some embodiments to create associations between instance items connected to a logical net in a functional design and a net topology structure that provides guidance as to the preferred physical implementation of the net during routing.

Figure 6:
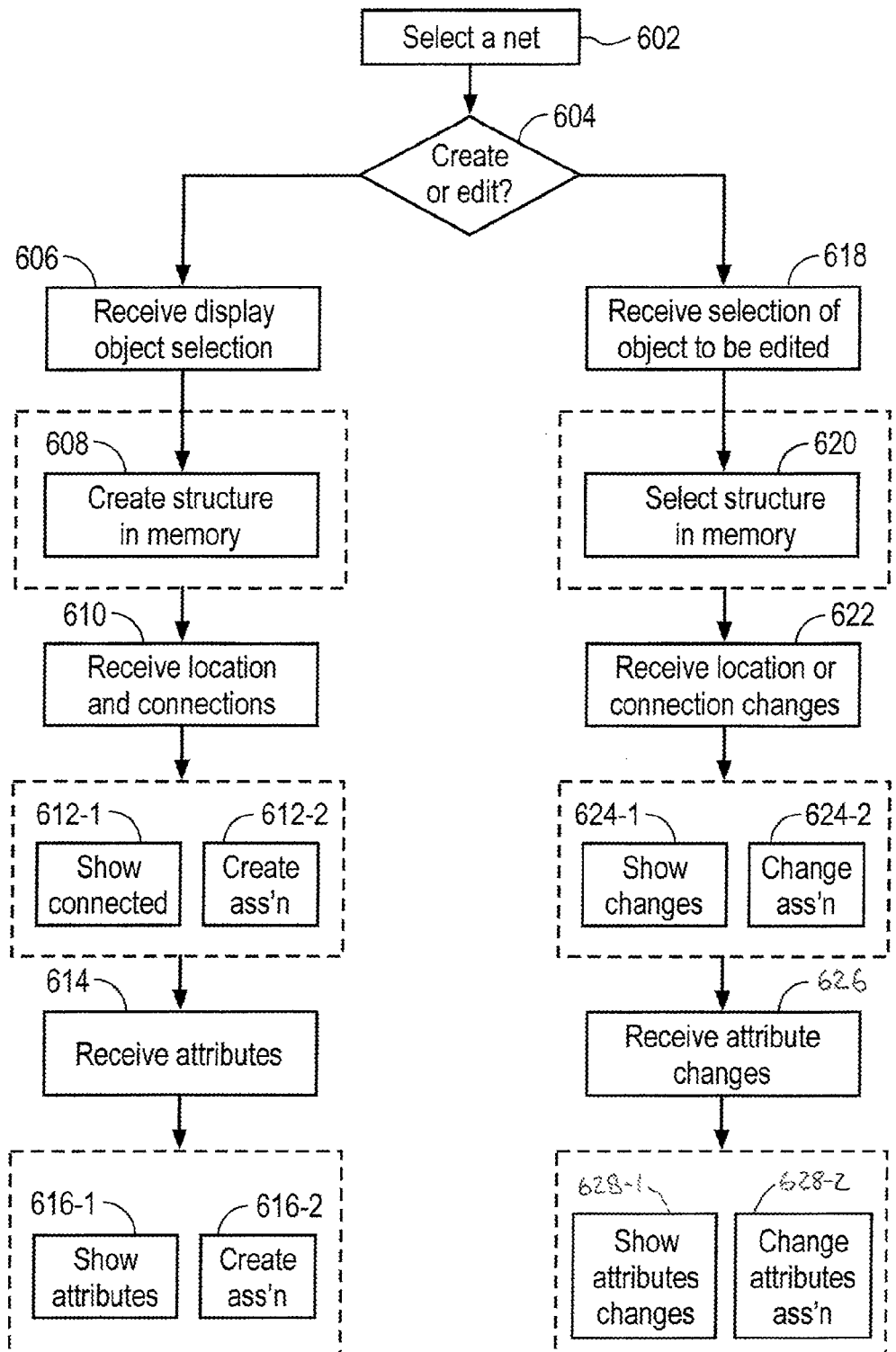
FIG. 6 is an illustrative flow diagram of a process to create and edit display objects to assemble a display of a net topology pattern and a corresponding net topology pattern structure in a computer readable storage device in accordance with some embodiments.

FIG. 6 is an illustrative flow diagram of a process 600 to create and edit display objects to assemble a display of a net topology pattern on a computer display screen and a corresponding net topology pattern structure stored in a computer readable storage device in accordance with some embodiments. In response to user input to the selection menu region selecting a net, module 602 selects a net within a functional design. In response to further user input to the selection menu region, decision module 604 determines whether user input indicates a user selection to create a new display object or to edit a previously created display object. In response to user input selecting to create a new display object, control flows from decision module 604 to module 606.

In response to module 606 receiving user input selecting a kind of display object to be created, module 608 creates a data structure instance type in a storage device that corresponds to the new display object. The dashed line about module 608 indicates that module 608 is responsive to user input received by module 606. In accordance with some embodiments, a user may provide input to module 606 indicating a selection from among a trunk display object, a twig display object, a trunk connection display object and a strap display object. Each of these display objects can be used to represent a constraint for use to guide a routing tool in generating information used to produce physical structures corresponding to the trunk pattern display during routing to implement a logical net. Module 608, in response to the user selection of a data display object, creates a corresponding matching data structure type from among a trunk structure type, a twig structure type, a trunk connection structure type and a strap structure type. Control next flows to module 610.

In response to module 610 receiving user input indicating a location on the canvas for the new display object and specifying any connections between the new display object other display objects or instance items, module 612-1 displays the new display object in the indicated location on the canvas with the specified connections to other objects or items. Also, in response to the user input received by module 610, module 612-2 creates one or more associations in a storage device between the data structure type instance corresponding to the new display object and data structure instances corresponding to the other objects or items in the display to which the new object is shown to be connected. Control next flows to module 614.

In response to module 614 receiving user input indicating attribute information associated with the new display object, module 616-1 displays the attribute information on the navigator display screen. Also, in response to the user input received by module 614, module 616-2 creates an association in a storage device between the data structure type instance corresponding to the new display object and the attribute information.

On the other hand, in response to decision module 604 receiving user input selecting to edit an existing display object, control flows from decision module 604 to module 618. In response to module 618 receiving user input selecting an existing display object to be edited, module 620 selects a data structure instance type in the storage device that corresponds to the display object to be edited. Control next flows to module 622.

In response to module 622 receiving user input indicating at least one of a change in location on the canvas or a change in connections for the selected display object to be edited, module 624-1 displays the selected display object with changed location and/or connections in accordance with the received user input. Also, in response to the user input received by module 622, module 624-2 changes one or more associations in the storage device between the selected data structure type instance corresponding to the display object to be edited and data structure instances corresponding to the other objects or items in the display to which the new object is shown to be connected. Control next flows to module 626.

In response to module 626 receiving user input indicating a change in attribute information associated with the selected display object, module 628-1 displays the changed attribute information on the navigator display screen. Also, in response to the user input received by module 626, module 628-2 associates the changed attribute information with the display structure instance selected by module 620.

Thus, it will be appreciated that a net topology pattern display is created and edited through creation and editing of display objects that are constituents of the display. Also, a net topology pattern structure in device storage is created and edited through creation and editing of a corresponding net topology pattern display. Moreover, data structure instances of the topology pattern structure in device storage can act as constraints upon a router tool used to route signal connection paths within an IC design. Therefore, a graphical user interface is provided that uses graphical representations of routing structures to create and edit routing constraints used by a computer system configured to generate signal paths in an IC design.

Figure 7:
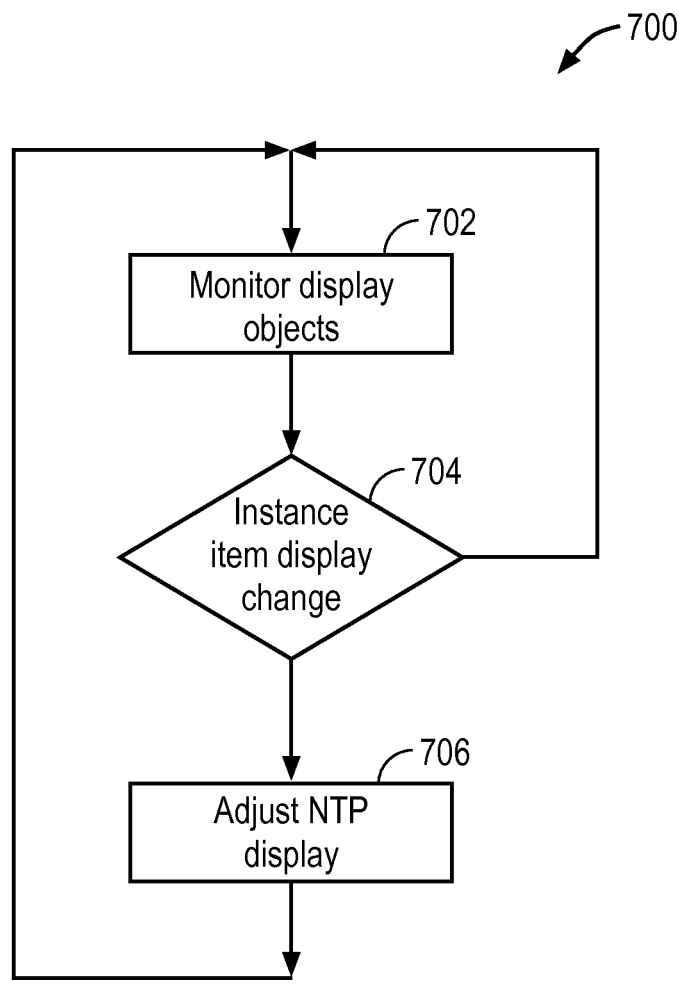
FIG. 7 is an illustrative drawing of a process to adjust a display of a net topology pattern to maintain a connection with an instance item of a functional circuit design in response to change in location or size of the instance item in the display in accordance with some embodiments.

FIG. 7 is an illustrative drawing of a process 700 to adjust a display of a net topology pattern to maintain a connection with an instance item of a functional circuit design in response to change in location or size of the instance item in the display in accordance with some embodiments. A display of a net topology structure created in accordance with some embodiments adapts to changes in display of location and/or orientation of instance items of a functional design that are displayed as being connected to the net topology structure. More particularly, for example, in the course of designing an integrated circuit, a user/circuit designer may change dimensions or location of instance items within a functional design. Module 702 monitors instances displayed within the canvas. Decision module 704 determines whether there has been a change to a monitored instance that affects connections within the net topology pattern display. If 'yes', then module 706 adjusts the net topology pattern display to maintain a display of the connection. Following modules 702 and/or 704, control flows to module 702.

FIG. 8 is an illustrative drawing showing a succession of three screen displays showing adjustment of a trunk display object to movement of an instance item in the design in accordance with some embodiments. In the left-side screen display, a net topology pattern is shown that includes a trunk display object and three twig display objects, each connected to a different one of instance items I1-I3 displays. In the middle screen display, the right-most instance item I3 is moved further to the right such that it is separated from the twig to which it had been connected in the left-most display. In the right-most screen display, the trunk display object is shown to have adjusted automatically to re-connect the twig to the moved instance item I3.

FIG. 9 is an illustrative drawing showing a succession of three screen displays showing adjustment of a twig display object to movement of an instance item in the design in accordance with some embodiments. In the left-side screen display, a net topology pattern is shown that includes a trunk display object and three twig display objects, each connected to a different one of instance items I1-I3 displays. In the middle screen display, the right-most instance item I3 is moved upward such that it is separated from the twig display object to which it had been connected in the left-most display. In the right-most screen display, the twig display object is shown to have adjusted automatically to re-connect the twig display object to the moved instance item I3.

Channel Based Routing Structures

Channel based routing involves defining signal routing structures within channels. As used herein, a 'channel' is a region within a design disposed between rows or columns of functional device structures, body contacts, guard rings, or pins, for example. Functional device structures are aligned within a design so as to define channels where net topology patterns can be disposed to interconnect the functional device structures. In general, a channel-based routing tool uses interconnect structures that include "trunks" and "twigs" to produce connections between instance items in a design. A trunk structure is an interconnect structure that is oriented in a design to run parallel to the channel in which it is disposed. A twig structure (sometimes referred to as a "branch") is an interconnect structure that connects a trunk structure to instance item. A twig structure is oriented in a design to run perpendicular to the channel in which it is disposed.

Figure 10:
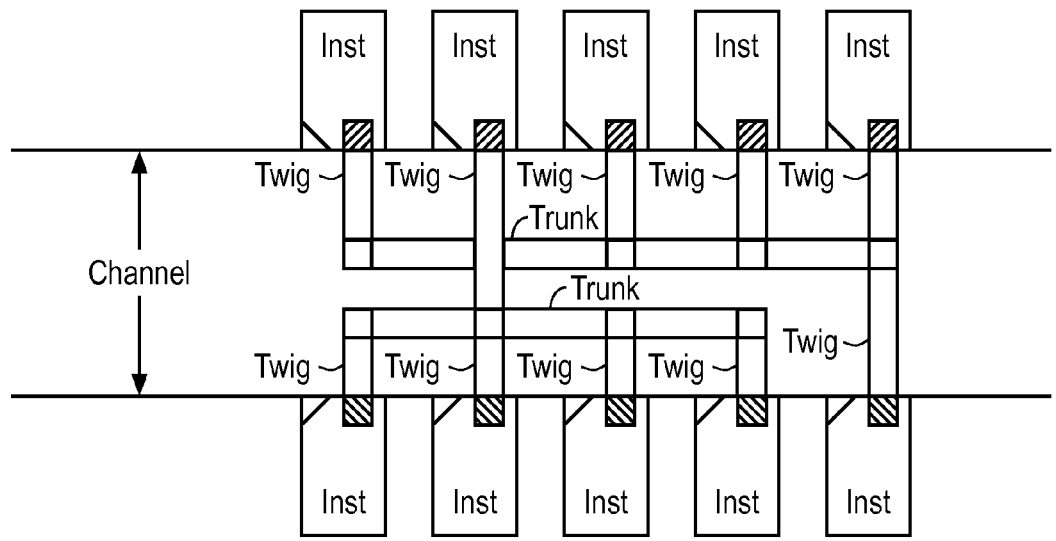
FIG. 10 is an illustrative drawing representing a screen display that shows channel in which a trunk structure and twig structures are disposed and that shows instance items disposed adjacent the channel and connected to the twig structures in accordance with some embodiments.

FIG. 10 is an illustrative drawing representing a screen display that shows channel in which a trunk structure and twig structures are disposed and that shows instance items disposed adjacent the channel and connected to the twig structures in accordance with some embodiments. Instance items are shown disposed along both sides of the channel. Some are disposed along a first side of the channel and others are disposed along a second side of the channel opposite the first side.

Figure 11:
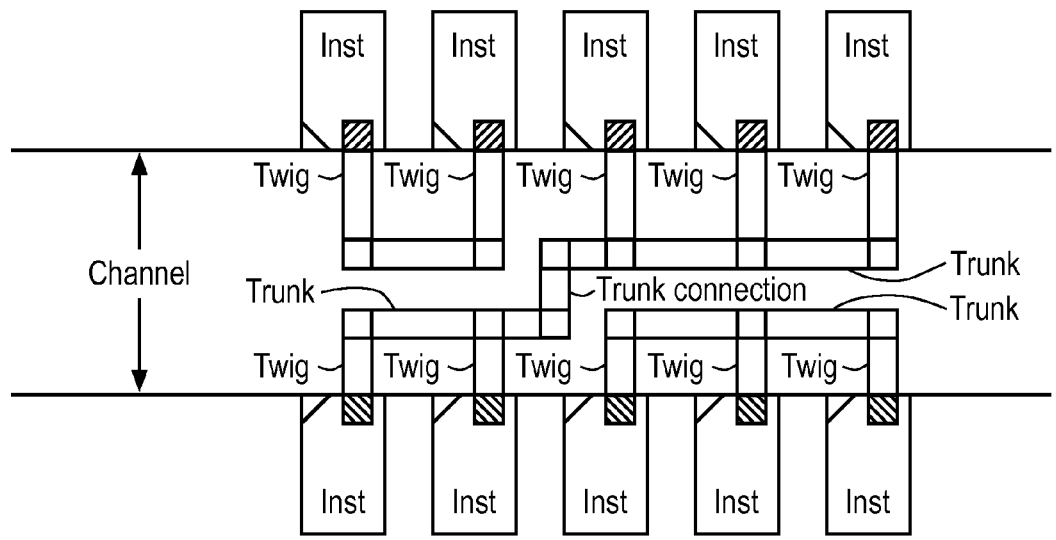
FIG. 11 is an illustrative drawing representing a screen display that shows trunk structures, twig display objects and a trunk connection display object disposed within a channel and that shows instance items disposed adjacent the channel and connected to the twig structures in accordance with some embodiments.

FIG. 11 is an illustrative drawing representing a screen display that shows trunk structures, twig structures and a trunk connection structure disposed within a channel and that shows instance items disposed adjacent the channel and connected to the twig structures in accordance with some embodiments. In general, a channel-based routing tool uses a "trunk connection" interconnect structure (sometimes referred to as a "dogleg") to connect together two or more trunk structures.

Figure 12:
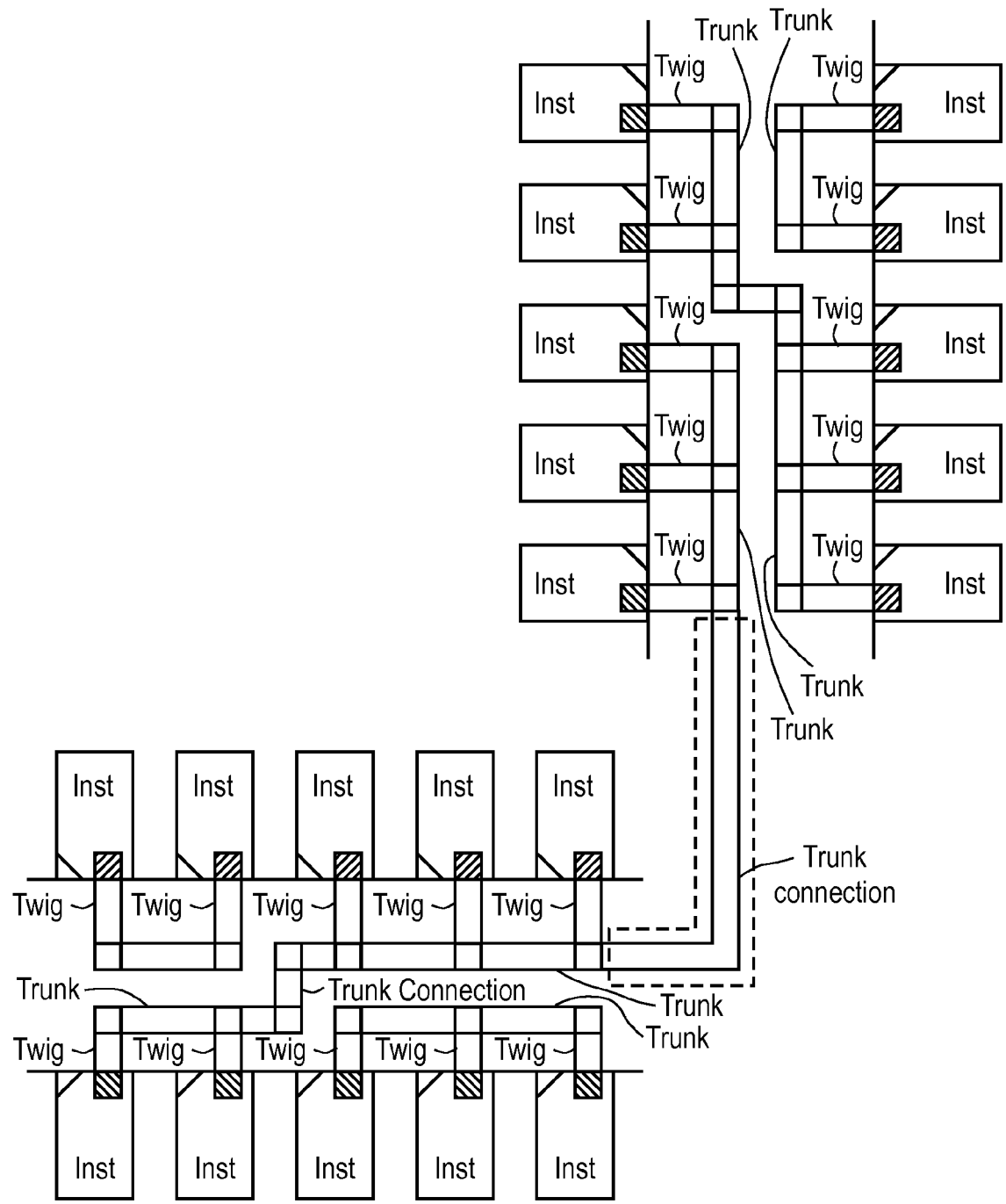
FIG. 12 is an illustrative drawing representing a screen display that shows trunk, twig and trunk connection display objects disposed within channels in a design that are oriented perpendicular to each other in a design in accordance with some embodiments.

FIG. 12 is an illustrative drawing representing a screen display that shows trunk, twig and trunk display objects disposed within channels in a design that are oriented perpendicular to each other in a design in accordance with some embodiments. Instances items are aligned along opposite sides of each of the channels. In general, a channel-based routing tool uses a trunk connection to interconnect trunk structures. The trunk connection structure of FIG. 12 interconnects a trunk structure disposed within a vertically oriented channel and a trunk structure disposed within a horizontally oriented channel.

Figure 13:
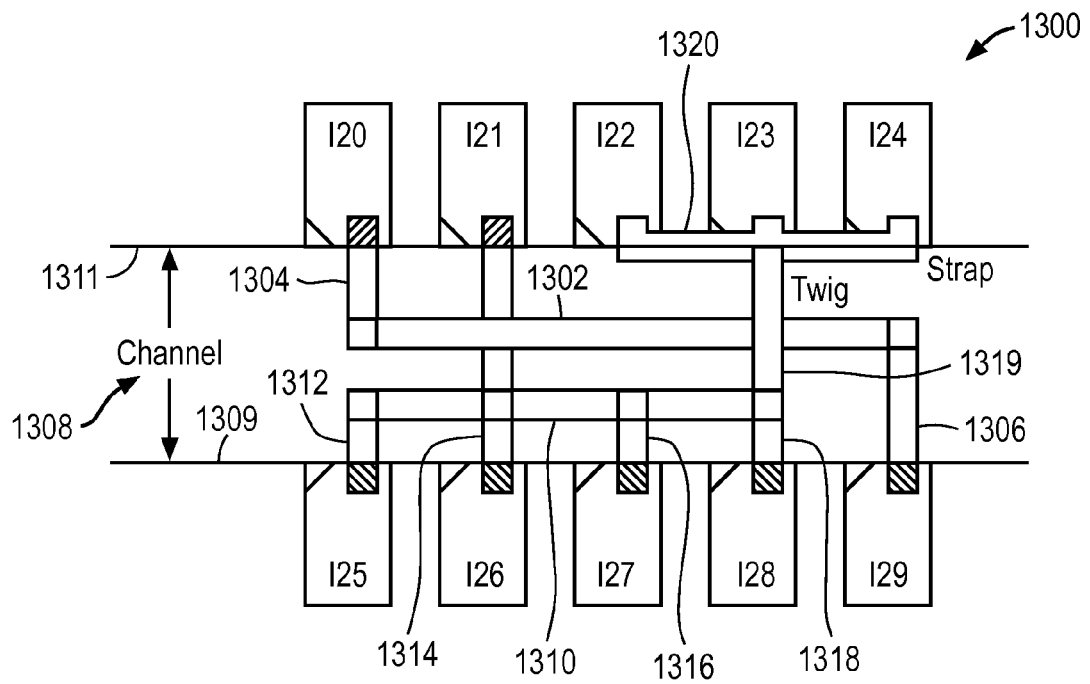
FIG. 13 is an illustrative drawing representing a screen display that shows trunk, twig and strap display object disposed within a channel in a design connected to instance items disposed adjacent the channel in accordance with some embodiments.

FIG. 13 is an illustrative drawing representing a net topology pattern screen display 1300 that includes trunk, twig and strap display object, which are constituent display objects of the net topology pattern 1300, shown as disposed within a channel in a design connected to instance items disposed adjacent the channel in accordance with some embodiments. A channel-based routing tool in accordance with some embodiments can use a "strap" interconnect structure to interconnect instance items directly rather than through separate twigs connected to a trunk structure. It will be appreciated that a strap can be present to interconnect instance items, for example, independent of twigs and trunks. Also, it will be appreciated that a trunk can be present independent of twigs and straps, for example. In that case, for example, the trunk would be used to pass a signal on a net through the channel even though there were no connections in the channel. That signal could be used at either end of the channel, for example Trunk display object 1302 is connected to twig display objects 1304 and 1306 that are connected to instances I20 and I29, which are disposed on opposite sides of the channel 1308. Trunk display object 1310 is connected to twig display objects 1312, 1314, 1316, 1318, which are connected to instances I25, I26, I27 and I28, which are disposed on a first side 1309 of the channel 1308. Trunk display object 1310 also is connected to a twig display object 1319 which is connected to strap display object 1320, which connects instances I22, I23 and I24, which are aligned along a second side 1311 of the channel 1308 opposite the first side.

Figure 14:
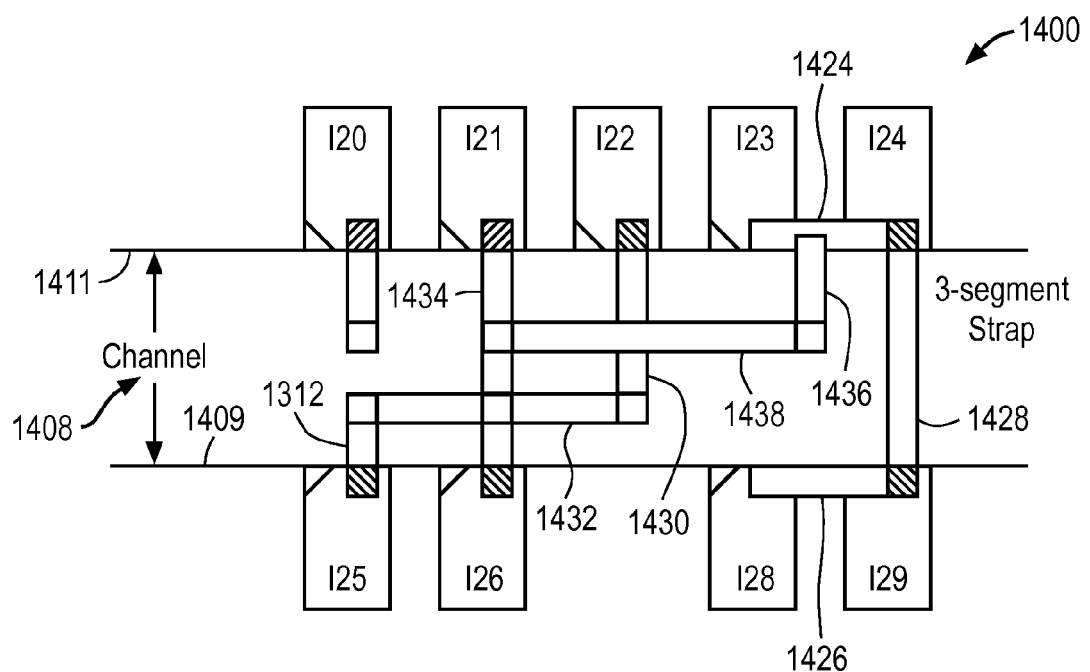
FIG. 14 is an illustrative drawing representing a screen display that shows trunks, twigs and a strap display object that extends perpendicularly across a channel to connect instance items on opposite sides of the channel in accordance with some embodiments.

FIG. 14 is an illustrative drawing representing a net topology pattern screen display 1400 that shows a strap display object, which is a constituent display object of the net topology pattern 1400, which extends perpendicularly across a channel to connect instance items on opposite sides of the channel in accordance with some embodiments. Instance items I23 and I24 aligned along a second side 1411 of the channel 1408 are connected to each other by a first strap display object 1424 that runs parallel to the channel 1408 on the second side 1409 of the channel. Instance items I28 and I29 aligned along a first side 1409 of the channel 1408 opposite the first side 1411 are connected to each other by a second strap display object 1426 that runs parallel to the channel on the second side 1409 of the channel. A third strap display object 1428 extends perpendicularly across the channel 1408 and interconnects the first and second strap structures 1424 and 1426. A twig display object 1430 connects I22 to the trunk display object 1432. Twig display objects 1434 and 1436 connect instance item I21 and strap display object 1424 to respective trunk display object 1438. Other display objects that are constituents of the pattern 1400 shown in FIG. 14 will be understood by persons skilled in the art and will not be described further.

Figure 15:
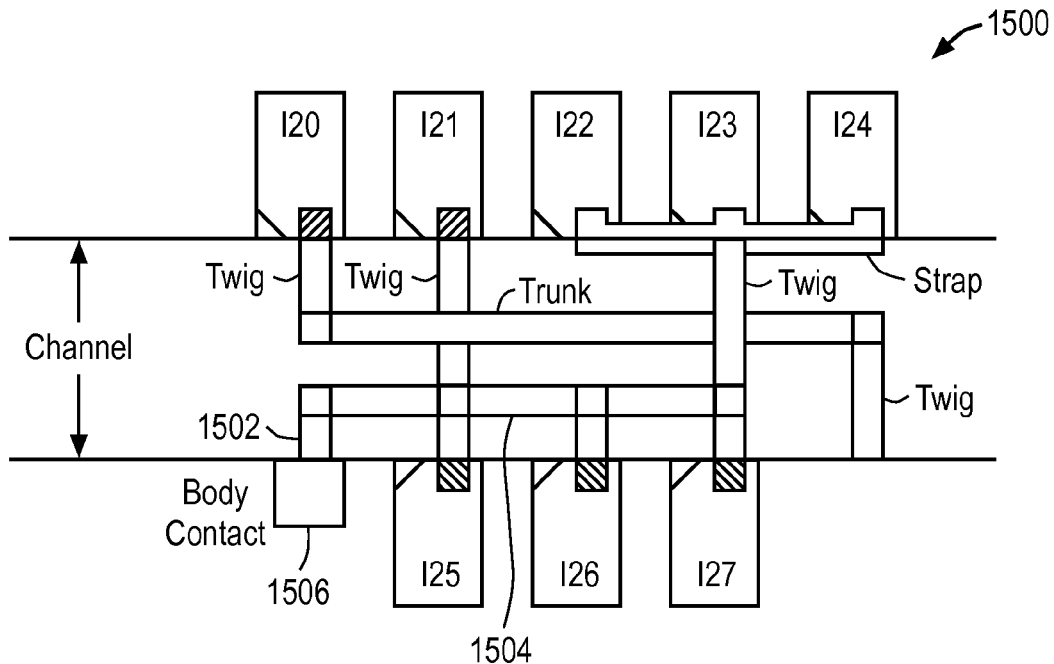
FIG. 15 is an illustrative drawing representing a screen display that shows a twig display object connecting a trunk display object to a body contact in a design in accordance with some embodiments.

FIG. 15 is an illustrative drawing representing a net topology pattern screen display 1500 that shows a twig display object 1502 connecting a trunk display 1504 object, each of which is a constituent of the pattern 1500, to a body contact 1506 in a design in accordance with some embodiments. The body contact 1506 may be a via, for example. Other display objects in FIG. 15 will be understood by persons skilled in the art from the discussion above, and therefore, are not explained further.

Figure 16:
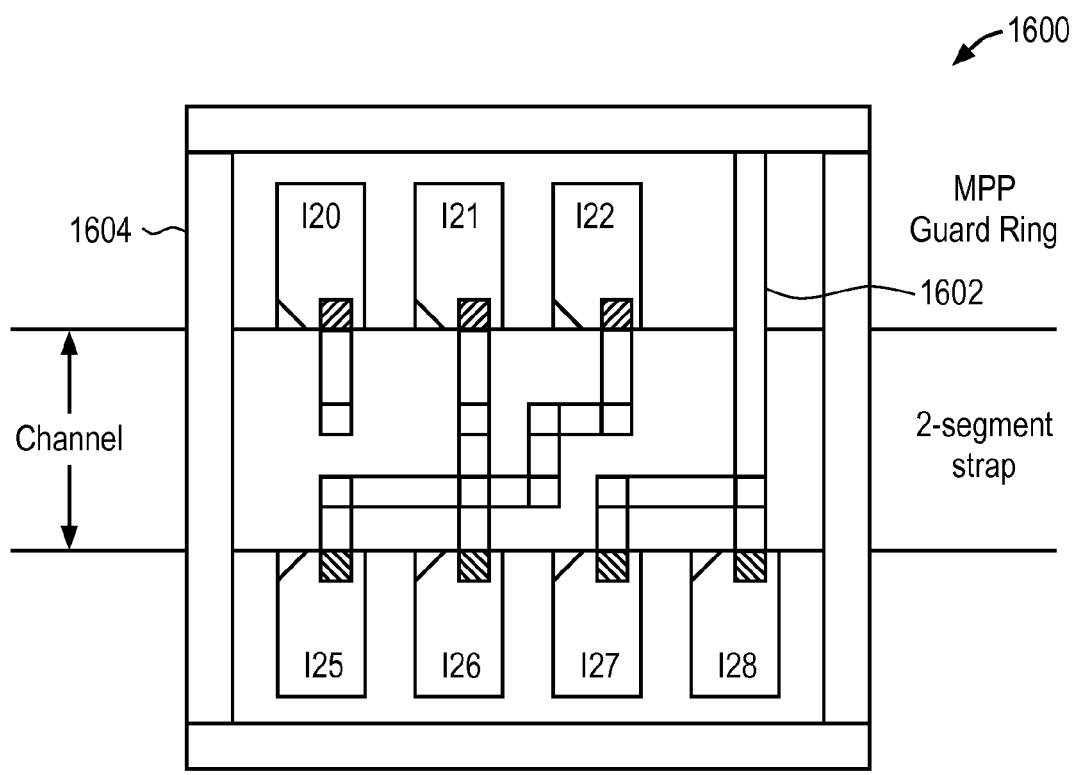
FIG. 16 is an illustrative drawing representing a screen display that shows a strap display object connecting instance items of a functional design to a guard ring in accordance with some embodiments.

FIG. 16 is an illustrative drawing representing a screen display 1600 that shows a strap display object 1602 connecting instance items of a functional design to a guard ring 1604 in accordance with some embodiments. It will be appreciated that a twig display object (not shown) can be used to interconnect a trunk display object to a guard ring. Other display objects in FIG. 16 will be understood by persons skilled in the art from the discussion above, and therefore, are not explained further.

It will be appreciated that although the examples described herein involve routing among instance items aligned along opposite sides of a channel, alternatively, routing may be performed among instance items aligned along only one side of a channel. Moreover the techniques described herein are applicable to defining net topology structures connected to devices in a design that are aligned in rows or columns. The techniques also are applicable even if the components are not aligned or the presence of a channel is not apparent.

Topology Pattern

Topology patterns such as trunk patterns, twig patterns, trunk connection patterns and strap patterns are associated with attributes that can act as directives provided to a channel-based router tool to automatically produce a graphical representation display of trunk-based routing among instance items in a design in accordance with some embodiments. The attributes, for example may be displayed and edited within an attributes display and editing region of a navigator screen display in accordance with some embodiments.

The trunk pattern attribute information types of Table 1 are used by a channel-based router tool to implement a trunk structure in accordance with some embodiments. The attributes of Table 1 can be edited through an attributes display and editing region of a navigator screen display. As used herein, a 'hard' attribute is one that is mandatory for actual routing, and a 'soft' attribute is one that is mandatory for display but is not mandatory and may be only a hint during actual routing. It will be appreciated that these attributes in Table 1 are examples; other attributes can be employed that represent kinds of information.

TABLE 1

Trunk Pattern Attribute Information Types
Trunk Pattern Attribute Information Types (Mandatory/Optional)

Net the trunk pattern applies to (Mandatory)
Constraint group specifying rules for this trunk (Mandatory)
Constraint group specifying default rules for twigs attached to this trunk (Mandatory)
Trunk direction: horizontal or vertical (Mandatory)
Trunk twig patterns (Mandatory)
Trunk anchor (instance item, trunk or boundary) and trunk side (right, left, bottom or top) (Mandatory)
Trunk orthogonal offset - distance from trunk anchor and trunk axis (Mandatory)
Trunk orthogonal offset hardness (Mandatory)
Soft: only used for trunk display purpose;
Hard: used both for display purpose and routing control
Trunk longitudinal offset (Optional)
Trunk connection patterns (Optional)
Repetition factor and a pitch (useful to create a mesh of trunks) (Optional)

Figure 17:
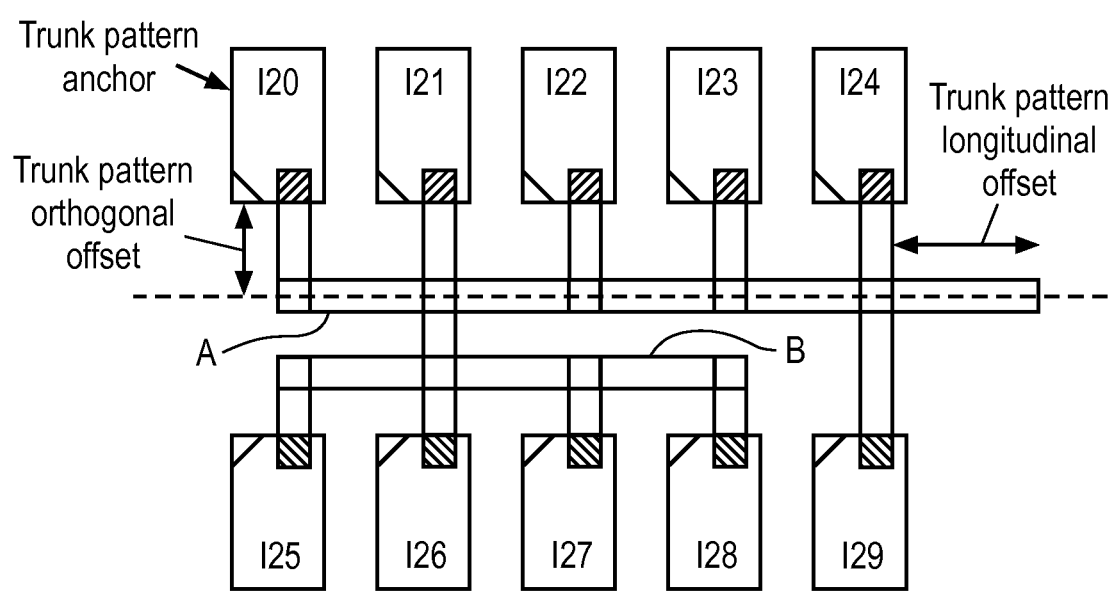
FIG. 17 is an illustrative drawing representing a screen display that shows trunk structure in a design and associated twig structures disposed within a channel connected to instance items disposed adjacent the channel in accordance with some embodiments.

FIG. 17 is an illustrative drawing representing a screen display that shows trunk structure in a design and associated twig structures disposed within a channel connected to instance items disposed adjacent to the channel in accordance with some embodiments. A trunk pattern longitudinal offset is shown, which represents the extension of the trunk beyond the twigs which are connected to it. A trunk pattern orthogonal offset is shown, which indicates a distance between the trunk structure and instance item nominated as an anchor interconnected with the trunk in a design using twig structures in accordance with some embodiments. The illustrative drawing of FIG. 17 shows two trunk structures, trunk structure A and trunk structure B.

Examples of some different combinations of trunk pattern attribute information for trunk structure A and trunk structure B are shown in Table 2 together with explanations.

TABLE 2

Different Example Trunk Pattern Attribute Information and Explanations

| Trunk Pattern A (top) | | | Trunk Pattern B (bottom) | | | |
| --- | --- | --- | --- | --- | --- | --- |
| anchor | offset | hardness | anchor | offset | hardness | Explanation |
| Inst1 | 50 | soft | Inst1 | 80 | soft | Both trunks below Inst1 |
| Inst1 | 50 | hard | Inst1 | 80 | soft | Trunk A 50n below Inst1 |
| | | | | | | Trunk B below Inst1 |
| Inst1 | 50 | hard | Inst1 | 80 | hard | Trunk A 50n below Inst1 |
| | | | | | | Trunk B 80n below Inst1 |
| Inst1 | 50 | soft | TP A | 80 | soft | Trunk A below Inst1 |
| | | | | | | Trunk B below Trunk A |
| Inst1 | 50 | hard | TP A | 80 | soft | Trunk A 50n below Inst1 |
| | | | | | | Trunk B below trunk A |
| Inst1 | 50 | hard | TP A | 80 | hard | Trunk A 50n below Inst1 |
| | | | | | | Trunk B 80n below Trunk A |

The twig pattern attribute information types of Table 3 are used by a channel-based router tool to implement a twig structure in accordance with some embodiments. The attributes of Table 3 can be edited through an attributes display and editing region of a navigator screen display.

TABLE 3

Twig Pattern Attribute Information Types
Twig Pattern Attribute Information Types (Mandatory/Optional)

Twig trunk pattern (Mandatory)
End object, one of the following: instance item, guard ring, shape, via, strap pattern, instance item wild card string (Mandatory)
Constraint group specifying rules for this twig (Optional)
End object justification (Optional)

The trunk connection pattern attribute information types of Table 4 are used by a channel-based router tool to implement a trunk connection structure in accordance with some embodiments. The attributes of Table 4 can be edited through an attributes display and editing region of a navigator screen display.

TABLE 4

Trunk Connection Pattern Attribute Information Types
Trunk Connection Pattern Attribute Information Types (Mandatory/Optional)

Start trunk (Mandatory)
End trunk (Mandatory)
Constraint group specifying rules for this trunk connection (optional)
Start trunk justification (optional)
End trunk justification (optional)

The strap pattern attribute information types of Table 5 are used by a channel-based router tool to implement a strap structure in accordance with some embodiments. The attributes of Table 5 can be edited through an attributes display and editing region of a navigator screen display.

TABLE 5

Strap Pattern Attribute Information Types
Strap Pattern Attribute Information Types (Mandatory/Optional)

List of: instance items, vias and or MPP guard ring shapes (Mandatory)
Constraint group specifying rules for this strap (Optional)

Figure 18:
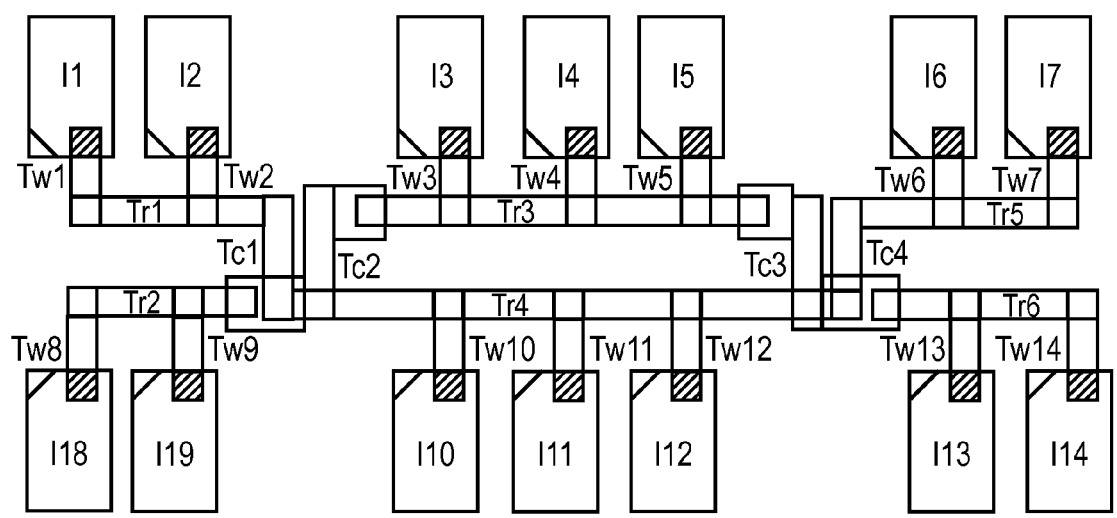
FIG. 18 is an illustrative drawing representing a screen display that shows a net topology pattern that can be displayed in a display canvas in accordance with some embodiments.

FIG. 18 is an illustrative drawing representing a screen display that shows a net topology pattern that can be displayed in a display canvas in accordance with some embodiments. The net topology pattern of FIG. 18 includes a plurality of instance items distributed along both sides of a channel in a design and includes interconnect structures disposed within the channel in accordance with some embodiments.

FIG. 19 is an illustrative drawing showing net pattern attribute information for the display objects that are constituents of the net topology pattern display of FIG. 18. The illustrative net pattern attribute information that can be edited through an attributes display and editing region of a navigator screen display. For example, referring to the trunk labeled Tr1 in FIG. 18 and to the attributes under the heading, i.e. menu item selection, 'Trunk Pattern Tr1' in FIG. 19, the first row of attributes indicates that a Twig Pattern attribute of Tr1 is associated with twig structures labeled Tw1 and Tw2 meaning that twigs Tw1 and Tw2 are associated with Tr1. The second row of attributes indicates that an Anchor attribute for Tr1 is the instance item labeled I1 As used herein, an "anchor" is an instance item or other design object nominated to specify the relative location of a trunk object. In this example we said the Tr1 is located below I1 The third row of attributes indicates that a Side attribute for Tr1 is on the bottom side of the anchor I1. The fourth row of attributes indicates that a Trunk Connection Pattern attribute for Tr1 is Tc1, meaning that trunk connection pattern Tc1 is associated with Tr1. A person of ordinary skill in the art will understand the correlation between attributes that can be displayed and edited through an attributes display and editing region of a navigator screen display and a corresponding trunk-based topology pattern displayed in a canvas display screen.

Data Structures

Figure 20:
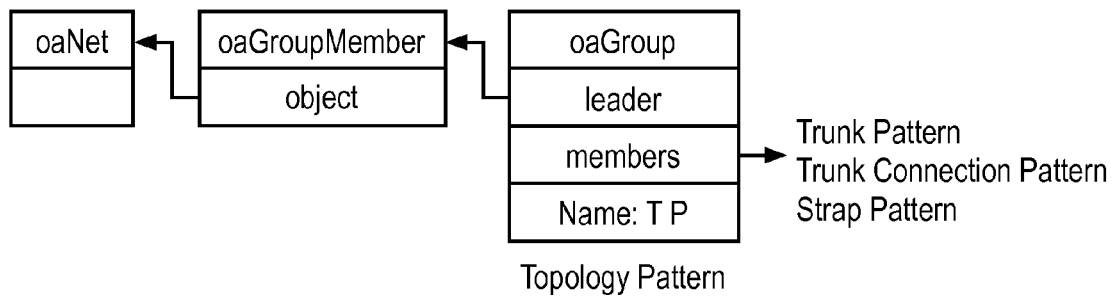
FIG. 20 is an illustrative drawing of a data structure type stored in a computer readable storage device that represents a net topology pattern in accordance with some embodiments.

FIG. 20 is an illustrative drawing of a data structure type representing a topology pattern of a net that is stored in a computer readable device. In some embodiments, data structures are created within a database that is compliant with the OpenAccess open specification of data API and reference database implementation, which was developed by the Silicon Integration Initiative, Inc. (Si2™), and which specifies unified data exchange among integrated circuit design tools through an open standard and reference database supporting that API for integrated circuit design.

In some embodiments, a visual display of a net topology pattern displayed on a computer user interface (UI) display screen corresponds to an instance of a net data structure type stored in a computer readable storage device. The net data structure defines a topology pattern that matches a corresponding net topology pattern displayed on the display screen. A net object pattern displayed on a display screen may include other object patterns such as trunk patterns, twig patterns, trunk connection patterns and strap patterns. The net data structure identifies other data structures associated with the net that correspond to other object patterns that contribute to the topology pattern of the net. The net data structure also may define attributes of the net, which actually may be set forth as attributes of other data structures that are associated with the net data structure.

In some embodiments, the OpenAccess (oa) specification is used to define net trunk, twig, trunk connection and strap data structure types. It will be appreciated, however, that other frameworks may be used to define net, trunk, twig, trunk connection and strap data structure types. Referring to FIG. 20, in some embodiments, a hierarchical data structure representation of a net topology pattern for a given net includes an oaGroup type that is associated with the given net, which is lead by the given net. The oaGroup type also is associated with group members that include one or more of a trunk pattern, a trunk connection pattern and a strap pattern. In some embodiments, the data structure corresponding to the given net has the name "Topology Pattern" ("TP"). In particular, an oaNet structure is associated as a leader with the TP oaGroup structure through a leader field of the TP oaGroup structure and an oaGroupMember structure.

It will be appreciated that a routing tool configures a computer to use one or more data structure types stored in a computer readable storage device to generate a visual display of a trunk-based topology pattern that has connections that may be defined by a logical net between instance items of a functional design, and that has attributes that represent physical parameters (e.g., dimensions, offsets, orientation relative to channel and other structures) used to implement connections between the instance items.

Figure 21:
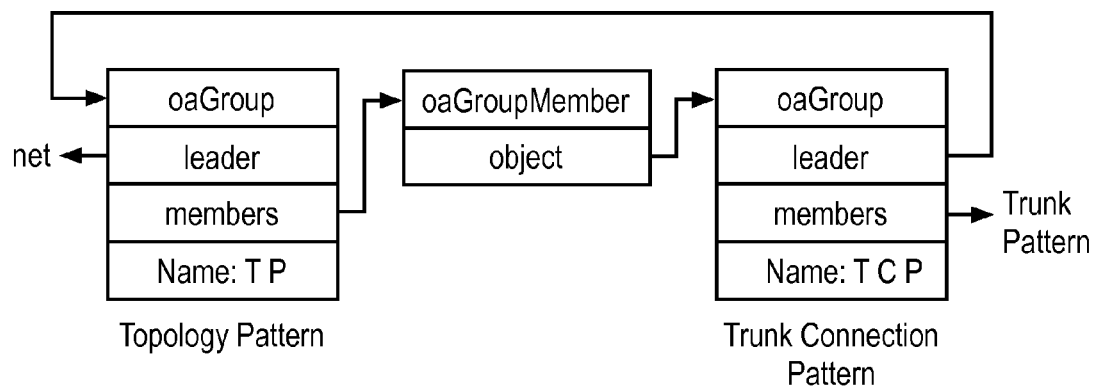
FIG. 21 is an illustrative drawing showing example additional details of the TP structure of FIG. 20 in accordance with some embodiments.

FIG. 21 is an illustrative drawing showing example additional details of the TP oaGroup structure of FIG. 20 in accordance with some embodiments. A member field of the TP oaGroup structure is associated through a member field of the TP oaGroup structure and an oaGroupMember structure with a "Trunk Connection Pattern" ("TCP") structure. The TCP oaGroup is associated through its leader field with the TP oaGroup, which is the leader of the TCP oaGroup structure. A TCP oaGroup may have as members one or more trunk patterns. Multiple TCP groups and associated oaGroupMembers may be present in a TP member field to indicate there are multiple trunk connection patterns.

Figure 22:
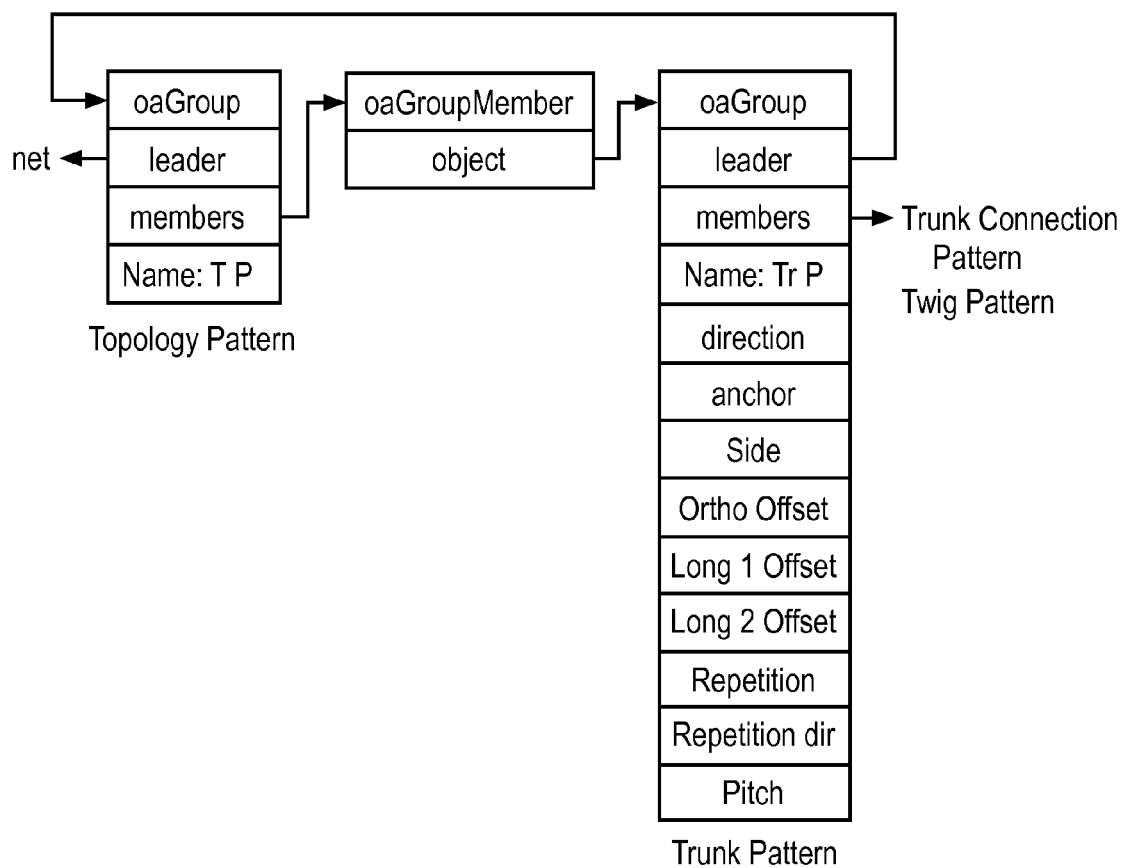
FIG. 22 is an illustrative drawing showing example additional details of the TP structure FIG. 20 in accordance with some embodiments.

FIG. 22 is an illustrative drawing showing example additional details of the TP oaGroup structure FIG. 20 in accordance with some embodiments. A member field of the TP oaGroup structure is associated through a member field of the TP oaGroup structure and an oaGroupMember structure with a "Trunk Pattern" ("TrP") structure. The TrP oaGroup is associated through its leader field with the TP oaGroup, which is the leader of the TrP oaGroup structure. A TrP oaGroup may have as members zero or more trunk connection patterns and/or zero or more twig patterns. Multiple TrP groups and associated oaGroupMembes may be present in a TP member field to indicate there are multiple trunk patterns. A TrP oaGroup may include ("be decorated by") one or more of the following attributes indicated in Table 6. The attributes of Table 6 can be edited through an attributes display and editing region of a navigator screen display.

TABLE 6

Trunk Pattern Attributes (optional)

Figure 23:
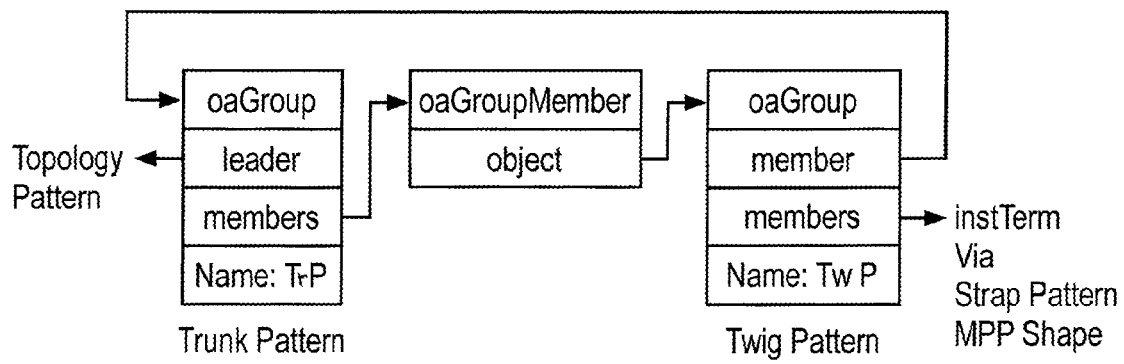
FIG. 23 is an illustrative drawing showing example additional details of the TrP structure of FIG. 20 in accordance with some embodiments.

Anchor: instance or trunk;
Side: bottom, top, left, right;
Ortho offset: orthogonal offset from anchor location;
Long 1 offset: bottom/left offset;
Long 2 offset: top/right offset.
Repetition: number of parallel trunks;
Repetition direction:
Top or bottom for horizontal trunk;
Left or right for vertical trunk.
Pitch: space in between parallel trunks FIG. 23 is an illustrative drawing showing example additional details of the TrP oaGroup structure of FIG. 20 in accordance with some embodiments. A member field of the TrP oaGroup structure is associated through a member field of the TrP oaGroup structure and an oaGroupMember structure with a "Twig Pattern" ("TwP") structure. The TwP oaGroup structure is associated through another member field with the TrP oaGroup structure. A TwP oaGroup structure may have as a member an instance item, a via, a strap pattern or a guard ring, for example. Multiple TwP groups and associated oaGroupMembes may be present in a TrP member field to indicate there are multiple twigs connected to a trunk, for example.

Figure 24:
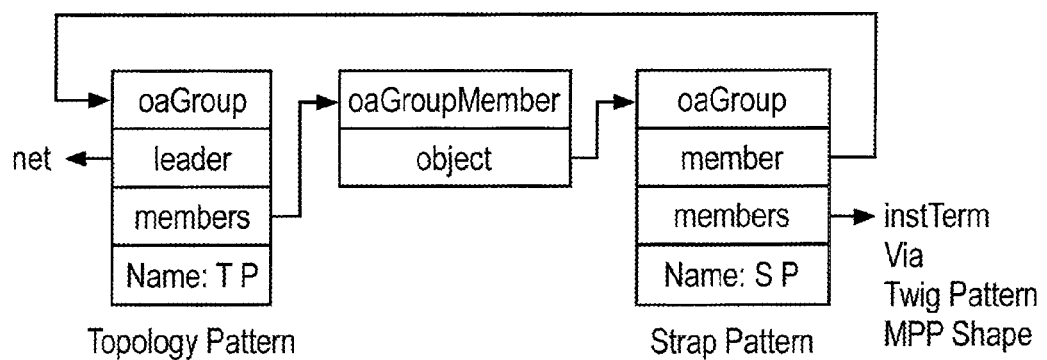
FIG. 24 is an illustrative drawing showing example additional details of TP structure of FIG. 20 in accordance with some embodiments.

FIG. 24 is an illustrative drawing showing example additional details of TP oaGroup structure of FIG. 20 in accordance with some embodiments. A member field of the TP oaGroup structure is associated through an oaGroupMember structure and a member field of the Strap Pattern ("SP") oaGroup structure. The SP oaGroup structure is associated through another member field with the TP oaGroup structure. A SP oaGroup structure may have as a member zero or more of instTerm, or terminal, Via, MPP shape, at most one twig pattern.

Figure 25A:
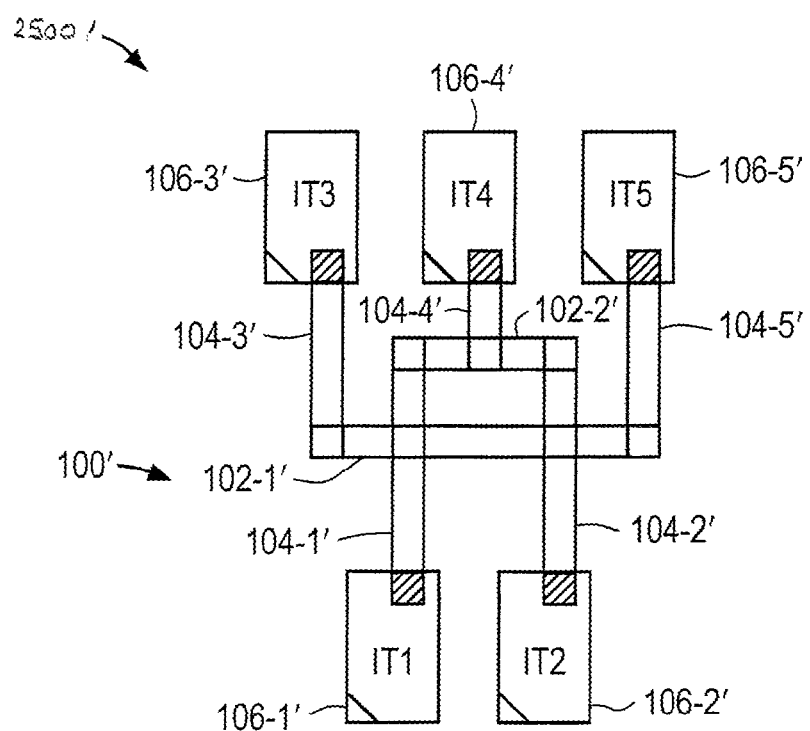
FIGS. 25A-25B are illustrative drawings to show correspondence between net topology display objects in a screen display (FIG. 25A) and net topology data structures (FIG. 25B) stored in a computer readable storage device in accordance with some embodiments.
Figure 25B:
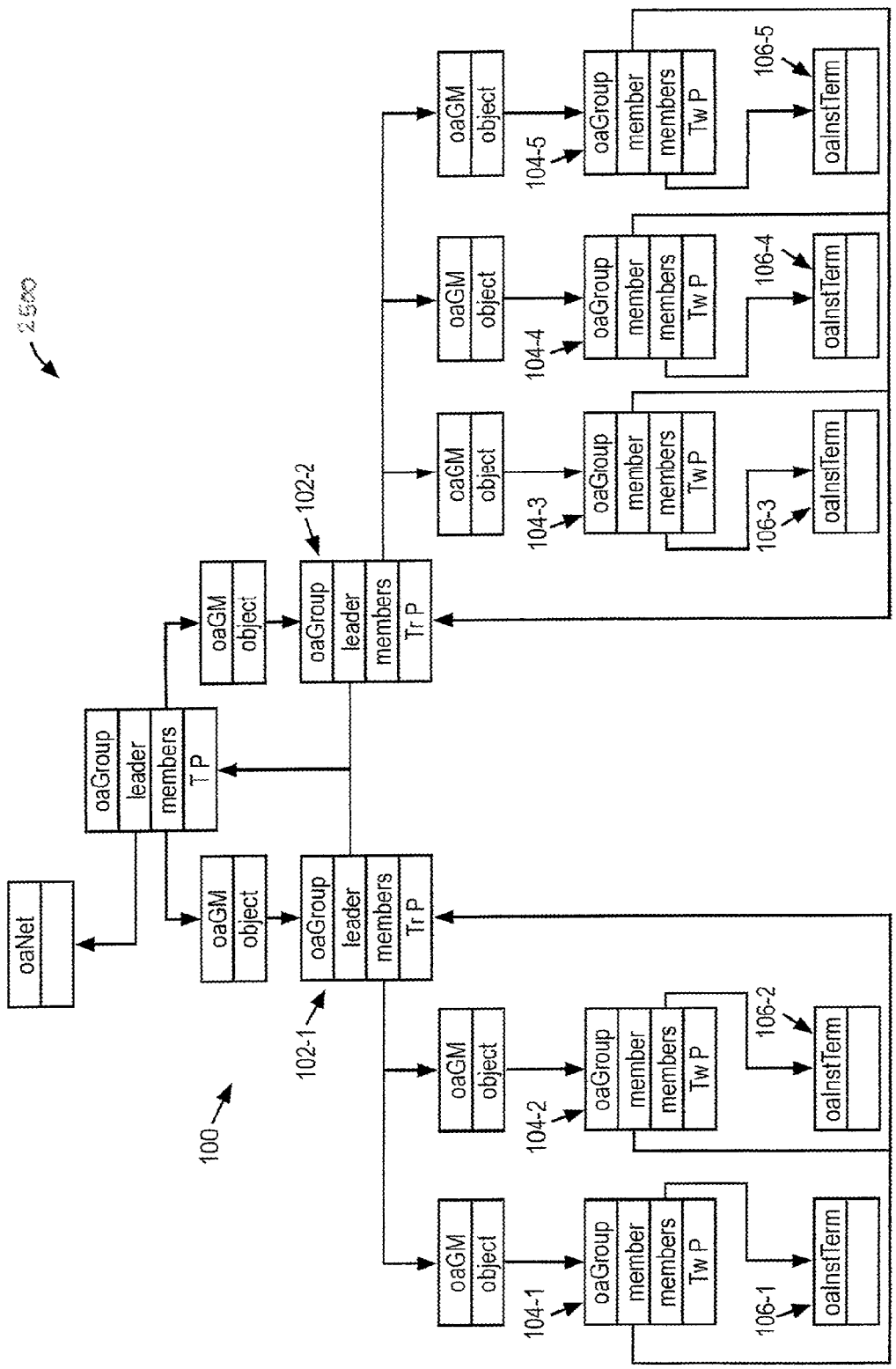

FIGS. 25A-25B are illustrative drawings to show correspondence between net topology display objects in a screen display (FIG. 25A) and net topology data structures (FIG. 25B) stored in a computer readable storage device in accordance with some embodiments. Display objects (e.g., 102-1' to 102-2' and 104-1' to 104-4') that are constituents of the net topology pattern display 2500' of FIG. 25A that correspond to data structure objects (e.g., 102-1 to 102-2 and 104-1 to 104-4) that are constituents of the stored net topology pattern structure 2500 in FIG. 25B are labeled with identical reference numerals that are labeled as primed in FIG. 25A. It will be understood that instance items display objects 106-1' to 106-5' of FIG. 25A represent constituents of a functional circuit (not shown), and that stored instance items structures 106-1 to 106-5 of FIG. 25B are shared within a common database between the topology pattern structure and the functional circuit structure that they are constituents of. Through corresponding reference numerals, a person skilled in the art will appreciate the correspondence between the hierarchical structure of display objects displayed on a computer display screen shown in FIG. 25A and the hierarchical structure of the stored net topology pattern structure of FIG. 25B.

Hardware Environment

Figure 26:
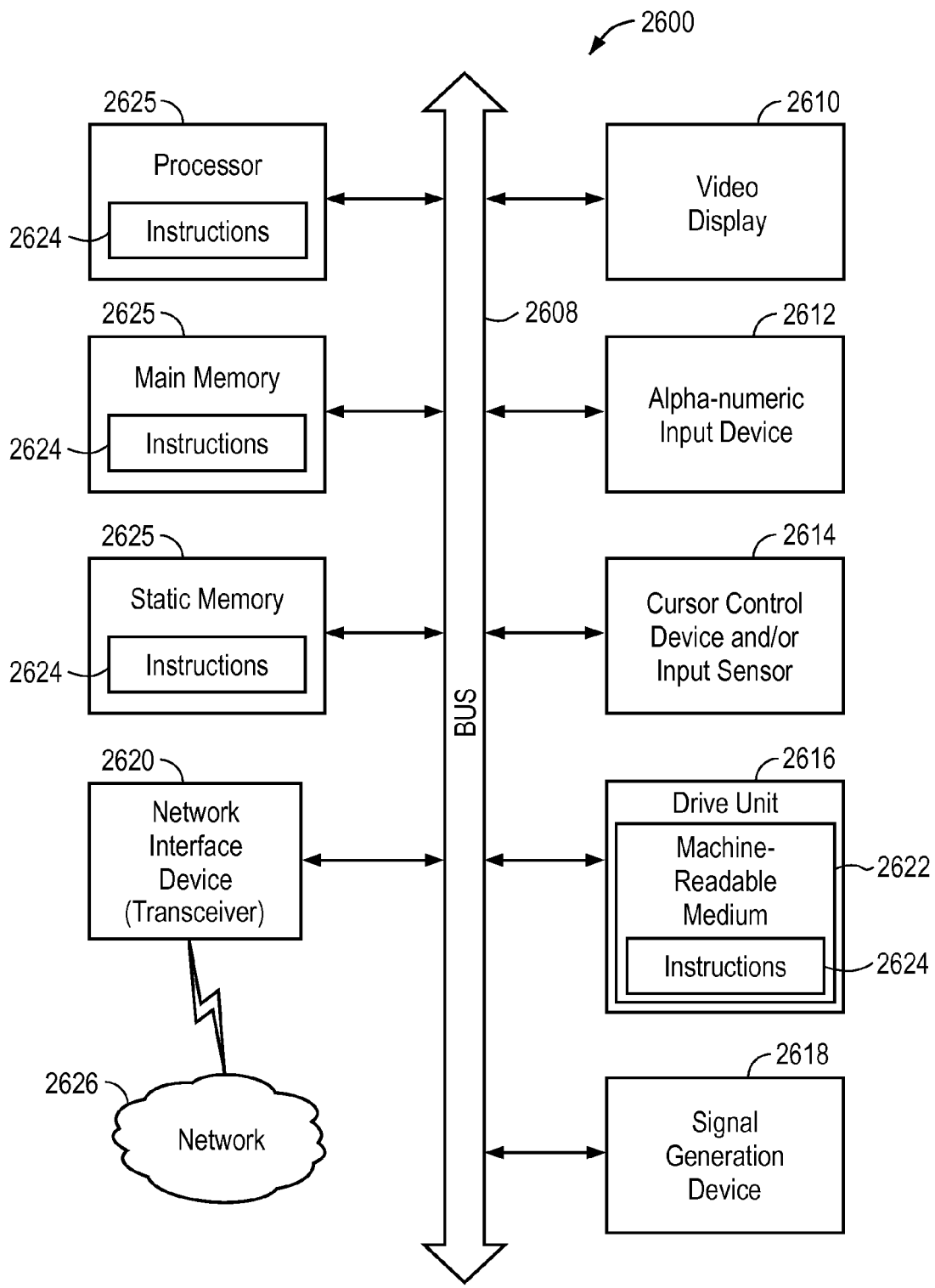
FIG. 26 shows a diagrammatic representation of a computer system that can be configured to perform any one or more of the methodologies discussed herein.

FIG. 26 shows a diagrammatic representation of a machine in the example form of a computer system 2600 within which a set of instructions, for causing the machine to perform any one or more of the methodologies discussed herein, may be executed. In alternative embodiments, the machine operates as a standalone device or may be connected (e.g., networked) to other machines. In a networked deployment, the machine may operate in the capacity of a server or a client machine in server-client network environment, or as a peer machine in a peer-to-peer (or distributed) network environment. The machine may be a server computer, a client computer, a personal computer (PC), a tablet PC, a set-top box (STB), a Personal Digital Assistant (PDA), a cellular telephone, a web appliance, a network router, switch or bridge, or any machine capable of executing a set of instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The example computer system 2600 includes a processor 2602 (e.g., a central processing unit (CPU), a graphics processing unit (GPU), or both), a main memory storage device 2604 and a static memory storage device 2606, which communicate with each other via a bus 908. The computer system 2600 may further include a video display unit 2610 (e.g., liquid crystal display (LCD), organic light emitting diode (OLED) display, touch screen, or a cathode ray tube (CRT)). The computer system 2600 also includes an alphanumeric input device 2612 (e.g., a keyboard, a physical keyboard, a virtual keyboard using software), a cursor control device or input sensor 2614 (e.g., a mouse, a trackpad, a trackball, a sensor or reader, a machine readable information reader, bar code reader), a disk drive unit 2616, a signal generation device 2618 (e.g., a speaker) and a network interface device or transceiver 2620.

The disk drive unit 2616 includes a machine-readable medium 2622 on which is stored one or more sets of instructions (e.g., software 2624) embodying any one or more of the methodologies or functions described herein. The software 2624 may also reside, completely or at least partially, within the main memory 2604 and/or within the processor 2602 during execution thereof by the computer system 2600, the main memory 2604 and the processor 2602 also constituting machine-readable media.

The software 2624 may further be transmitted or received over a network 526 via the network interface device 2620.

While the machine-readable medium 2622 is shown in an example embodiment to be a single medium, the term "machine-readable medium," "computer readable medium," and the like should be taken to include a single medium or multiple media (e.g., a centralized or distributed database, and/or associated caches and servers) that store the one or more sets of instructions. The term "machine-readable medium" shall also be taken to include any medium that is capable of storing, encoding or carrying a set of instructions for execution by the machine and that cause the machine to perform any one or more of the methodologies of the present disclosure. The term "machine-readable medium" shall accordingly be taken to include, but not be limited to, solid-state memories, optical and magnetic media, and carrier wave signals.

It will be appreciated that, for clarity purposes, the above description describes some embodiments with reference to different functional units or processors. However, it will be apparent that any suitable distribution of functionality between different functional units, processors or domains may be used without detracting from the present disclosure. For example, functionality illustrated to be performed by separate processors or controllers may be performed by the same processor or controller. Hence, references to specific functional units are only to be seen as references to suitable means for providing the described functionality, rather than indicative of a strict logical or physical structure or organization.

Certain embodiments described herein may be implemented as logic or a number of modules, engines, components, or mechanisms. A module, engine, logic, component, or mechanism (collectively referred to as a "module") may be a tangible unit capable of performing certain operations and configured or arranged in a certain manner. In certain example embodiments, one or more computer systems (e.g., a standalone, client, or server computer system) or one or more components of a computer system (e.g., a processor or a group of processors) may be configured by software (e.g., an application or application portion) or firmware (note that software and firmware can generally be used interchangeably herein as is known by a skilled artisan) as a module that operates to perform certain operations described herein.

In various embodiments, a module may be implemented mechanically or electronically. For example, a module may comprise dedicated circuitry or logic that is permanently configured (e.g., within a special-purpose processor, application specific integrated circuit (ASIC), or array) to perform certain operations. A module may also comprise programmable logic or circuitry (e.g., as encompassed within a general-purpose processor or other programmable processor) that is temporarily configured by software or firmware to perform certain operations. It will be appreciated that a decision to implement a module mechanically, in dedicated and permanently configured circuitry, or in temporarily configured circuitry (e.g., configured by software) may be driven by, for example, cost, time, energy-usage, and package size considerations.

Accordingly, the term "module" should be understood to encompass a tangible entity, be that an entity that is physically constructed, permanently configured (e.g., hardwired), or temporarily configured (e.g., programmed) to operate in a certain manner or to perform certain operations described herein. Considering embodiments in which modules or components are temporarily configured (e.g., programmed), each of the modules or components need not be configured or instantiated at any one instance in time. For example, where the modules or components comprise a general-purpose processor configured using software, the general-purpose processor may be configured as respective different modules at different times. Software may accordingly configure the processor to constitute a particular module at one instance of time and to constitute a different module at a different instance of time.

Modules can provide information to, and receive information from, other modules. Accordingly, the described modules may be regarded as being communicatively coupled. Where multiples of such modules exist contemporaneously, communications may be achieved through signal transmission (e.g., over appropriate circuits and buses) that connect the modules. In embodiments in which multiple modules are configured or instantiated at different times, communications between such modules may be achieved, for example, through the storage and retrieval of information in memory structures to which the multiple modules have access. For example, one module may perform an operation and store the output of that operation in a memory device to which it is communicatively coupled. A further module may then, at a later time, access the memory device to retrieve and process the stored output. Modules may also initiate communications with input or output devices and can operate on a resource (e.g., a collection of information).

Although the present disclosure has been described in connection with some embodiments, it is not intended to be limited to the specific form set forth herein. One skilled in the art would recognize that various features of the described embodiments may be combined in accordance with the present disclosure. Moreover, it will be appreciated that various modifications and alterations may be made by those skilled in the art without departing from the spirit and scope of the present disclosure.

In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

The invention claimed is:

1. A method to produce in a computer readable storage device constraint information for use by a computer configured to implement a routing process used to generate routing signal lines in an integrated circuit design comprising:

producing, by using the computer, a net topology pattern structure stored in the storage device that corresponds to a logical net that is associated in the storage device with at least two instance item structures of at least one functional design structure stored in the storage device, wherein the net topology pattern structure is associated in the storage device with the at least two instance item structures and includes multiple constituent structures that indicate at least one constraint upon physical implementation of the logical net structure;

wherein the multiple constituent structures include a trunk structure that is associated in the device with attribute information that includes a net the trunk structure applies to, a constraint group specifying rules for the trunk structure, and a constraint group specifying default rules for twigs attached to the trunk structure wherein the trunk structure is an interconnect structure that is oriented in a design to run parallel to a channel in which it is disposed, the twig structure is an interconnect structure that connects a trunk structure to instance item and the twig structure is oriented in a design to run perpendicular to the channel in which it is disposed; and wherein the channel is a region where the connections between trunk structures and twig structures are made.

2. The method of claim 1, wherein the multiple constituent structures include a trunk structure that is associated in the device with attribute information that indicates a physical position of the trunk structure relative to the at least one or more instance item structures.

3. The method of claim 2, wherein the trunk attribute information indicates a physical position of the trunk structure within a routing channel region relative to the at least one or more instance item structures.

4. The method of claim 1, wherein the multiple constituent structures includes a trunk structure that is associated in the device with attribute information that indicates a physical position of the trunk structure relative to the at least one or more instance item structures; and wherein the multiple constituent structures include a twig structure that indicates a physical connection between the trunk structure and at least one of the at least two instance item structures.

5. The method of claim 4, wherein the twig structure is associated in the device with attribute information that indicates a physical position of the twig structure relative to at least one of the at least two instance item structures.

6. The method of claim 5, wherein the twig attribute information indicates a physical position of the twig structure within a routing channel region relative to at least one of the at least two instance item structures aligned along the channel region.

7. The method of claim 1, wherein the at least one functional design structure stored in the device is not physically placed in the design when the act of producing occurs.

8. The method of claim 1, wherein the multiple constituent structures includes trunk structure that is associated in the device with attribute information that defines a physical position of the trunk structure relative to the at least two instance item structures;

wherein the multiple constituent structures further include a first twig structure that indicates a physical connection between the trunk structure and one of the at least two instance item structures; and wherein the multiple constituent structures further include a second twig structure that indicates a physical connection between the trunk structure and another of the at least two instance item structures.

9. The method of claim 1, wherein the multiple constituent structures include a trunk structure that is associated in the device with attribute information that defines a physical position of the trunk structure relative to the at least two instance item structures;

wherein the multiple constituent structures further include a strap structure that indicates a physical connection between the at least two instance item structures; and wherein the multiple constituent structures further include at least one twig structure that indicates a physical connection between the trunk structure and strap structure.

10. The method of claim 1, wherein the multiple constituent structures include a first trunk structure and a second trunk structure;

wherein the first trunk structure is associated that in the device with first attribute information that defines a physical position of the first trunk structure relative to at least one of the two instance item structures;

wherein the second trunk structure is associated that in the device with second attribute information that defines a physical position of the second trunk structure relative to at least another of the two instance item structures;

wherein the multiple constituent structures further include a trunk connection structure that defines a connection between the first trunk structure and a second trunk structure;

wherein the multiple constituent structures further include a first twig structure that indicates a physical connection between the first trunk structure and the at least one of the at least two instance item structures; and wherein the multiple constituent structures further include a second twig structure that indicates a physical connection between the second trunk structure and the at least another of the at least two instance item structures.

11. The method of claim 10, wherein the net topology pattern structure is associated in the device with attribute information that defines a physical position of the first trunk structure relative to the second trunk structure.

12. The method of claim 1, wherein producing the net topology pattern structure includes receiving by a computer instructions to assemble multiple constituent display objects on a display screen that correspond to the multiple constituent structures to produce a graphical net topology pattern display on the display screen.

13. The method of claim 12 further including:

receiving input to the computer that indicates attribute information associated with respective constituent display objects of the graphical net topology pattern display; and associating the received input in the device with respective corresponding constituent structures.

14. The method of claim 12 further including:

displaying on the display screen at least two instance item display objects that correspond to the at least two instance item structures of the at least one functional design structure;

wherein the topology pattern display includes one or more constituent display objects that connect with the at least two instance item display objects on the display screen.

15. The method of claim 14 further including:

automatically adjusting a display of one or more constituent display objects that connect with one or more of the at least two instance item display objects on the display screen to stay connected in response to a change in location or size of the one or more of the at least two instance item display objects on the display screen.

16. A method to produce in a computer readable storage device constraint information for use by a computer configured to implement a routing process used to generate routing signal lines in an integrated circuit design comprising:

receiving by a computer, instructions to assemble multiple constituent graphical display objects on a display screen to produce a graphical net topology pattern display that represents a logical net that is associated within the storage device with at least two instance item structures of at least one functional design structure stored in the storage device, wherein the net topology pattern display shows connections between one or more of its constituent graphical display objects and at least two instance item display objects shown on a display screen that represent the at least two instance item structures stored in the storage device;

in response to the assembling of the topology pattern display on the display screen, producing a net topology pattern structure stored in the storage device that is associated in the storage device with the at least two instance item structures and that includes multiple constituent structures that indicate at least one constraint upon physical implementation of the logical net structure;

wherein the multiple constituent structures include a trunk structure that is associated in the device with attribute information that includes a net the trunk structure applies to, a constraint group specifying rules for the trunk structure, and a constraint group specifying default rules for twigs attached to the trunk structure wherein the trunk structure is an interconnect structure that is oriented in a design to run parallel to a channel in which it is disposed, the twig structure is an interconnect structure that connects a trunk structure to instance item and the twig structure is oriented in a design to run perpendicular to the channel in which it is disposed; and wherein the channel is a region where the connections between trunk structures and twig structures are made.

17. The method of claim 16 further including:

automatically adjusting a display of one or more constituent display objects that connect with one or more of the at least two instance item display objects on the display screen to stay connected in response to a change in location or size of the one or more of the at least two instance item display objects on the display screen.

18. The method of claim 16 further including:

receiving input to the computer that indicates attribute information associated with respective constituent display objects of the graphical net topology pattern display; and associating the received input in the device with respective corresponding constituent structures.

19. The method of claim 16, wherein the multiple constituent display objects include a trunk display object that corresponds to the trunk structure;

wherein the multiple constituent display objects include a twig display object that connects the trunk display object with at least one of the at least two instance item display objects;

wherein the multiple constituent structures includes a trunk structure that is associated in the device with attribute information that indicates a physical position of the trunk structure relative to the at least one instance item structures; and wherein the multiple constituent structures include a twig structure that indicates a physical connection between the trunk structure and the at least one of the instance item structures.

20. The method of claim 16, wherein the multiple constituent structures includes trunk display object that corresponds to the trunk structure;

wherein the multiple constituent display objects further include a first twig display object that connects the trunk display object and one of the at least two instance item display objects;

wherein the multiple constituent display objects further include a second twig display object that connects the trunk display object and another of the at least two instance item display objects wherein the multiple constituent structures includes trunk structure that is associated in the device with attribute information that defines a physical position of the trunk structure relative to the at least two instance item structures;

wherein the multiple constituent structures further include a first twig structure that indicates a physical connection between the trunk structure and one of the at least two instance item structures; and wherein the multiple constituent structures further include a second twig structure that indicates a physical connection between the trunk structure and another of the at least two instance item structures.

21. The method of claim 16, wherein the multiple constituent display objects include a trunk display object that corresponds to the trunk structure;

wherein the multiple constituent display objects further include a strap display object that connects the at least two instance item display objects;

wherein the multiple constituent display objects further include at least one twig display object that connects the trunk display object and strap display object wherein the multiple constituent structures include trunk structure that is associated in the device with attribute information that defines a physical position of the trunk structure relative to the at least two instance item structures;

wherein the multiple constituent structures further include a strap structure that indicates a physical connection between the at least two instance item structures; and wherein the multiple constituent structures further include at least one twig structure that indicates a physical connection between the trunk structure and strap structure.

22. The method of claim 16, wherein the multiple constituent display object include a first trunk display object that corresponds to the first trunk structure and include a second trunk display object that corresponds to the second trunk structure;

wherein the multiple constituent structures further include a second twig structure that indicates a physical connection between the second trunk structure and the at least another of the at least two instance item structures;

wherein the multiple constituent display objects further include a trunk connection display object that connects first trunk display object and a second trunk display object;

wherein the multiple constituent display object further include a first twig display object that connects the first trunk display object and the at least one of the at least two instance item display objects; and wherein the multiple constituent display objects further include a second twig display object that connects the second trunk display object and the at least another of the at least two instance item display objects;

wherein the multiple constituent structures include a first trunk structure and a second trunk structure;

wherein the first trunk structure is associated that in the device with first attribute information that defines a physical position of the first trunk structure relative to at least one of the two instance item structures;

wherein the second trunk structure is associated that in the device with second attribute information that defines a physical position of the second trunk structure relative to at least another of the two instance item structures;

wherein the multiple constituent structures further include a trunk connection structure that defines a connection between the first trunk structure and a second trunk structure; and wherein the multiple constituent structures further include a first twig structure that indicates a physical connection between the first trunk structure and the at least one of the at least two instance item structures.

23. An article of manufacture that includes a computer readable storage device that includes computer readable code to configure a computer to perform a method to produce constraint information for use by a routing process to generate routing signal lines in an integrated circuit design, the method comprising:

producing a net topology pattern structure stored in the storage device that corresponds to a logical net that is associated in the storage device with at least two instance item structures of at least one functional design structure stored in the storage device, wherein the net topology pattern structure is associated in the storage device with the at least two instance item structures and includes multiple constituent structures that indicate at least one constraint upon physical implementation of the logical net structure;

wherein the multiple constituent structures include a trunk structure that is associated in the device with attribute information that includes a net the trunk structure applies to, a constraint group specifying rules for the trunk structure, and a constraint group specifying default rules for twigs attached to the trunk structure wherein the trunk structure is an interconnect structure that is oriented in a design to run parallel to a channel in which it is disposed, the twig structure is an interconnect structure that connects a trunk structure to instance item and the twig structure is oriented in a design to run perpendicular to the channel in which it is disposed; and wherein the channel is a region where the connections between trunk structures and twig structures are made.

24. The article of claim 23 wherein the multiple constituent structures include a trunk structure that is associated in the device with attribute information that indicates a physical position of the trunk structure relative to the at least one or more instance item structures.

25. The article of claim 24, wherein the trunk attribute information indicates a physical position of the trunk structure within a routing channel region relative to the at least one or more instance item structures.

26. The article of claim 23, wherein the at least one functional design structure stored in the device is not physically placed in the design when the act of producing occurs.

27. The article of claim 23, wherein producing the net topology pattern structure includes receiving by a computer instructions to assemble multiple constituent display objects on a display screen that correspond to the multiple constituent structures to produce a graphical net topology pattern display on the display screen.

28. The article of claim 27 further including:

displaying on the display screen at least two instance item display objects that correspond to the at least two instance item structures of the at least one functional design structure;

wherein the topology pattern display includes one or more constituent display objects that connect with the at least two instance item display objects on the display screen.

29. The article of claim 28 further including:

automatically adjusting a display of one or more constituent display objects that connect with one or more of the at least two instance item display objects on the display screen to stay connected in response to a change in location or size of the one or more of the at least two instance item display objects on the display screen.

30. An article of manufacture that includes a computer readable storage device that includes computer readable an information structure that represents constraint information, the information structure comprising:

a net topology pattern structure stored in the storage device that corresponds to a logical net that is associated in the storage device with at least two instance item structures of at least one functional design structure stored in the storage device, wherein the net topology pattern structure is associated in the storage device with the at least two instance item structures and includes multiple constituent structures that indicate at least one constraint upon physical implementation of the logical net structure;

wherein the multiple constituent structures include a trunk structure that is associated in the device with attribute information that includes a net the trunk structure applies to, a constraint group specifying rules for the trunk structure, and a constraint group specifying default rules for twigs attached to the trunk structure wherein the trunk structure is an interconnect structure that is oriented in a design to run parallel to a channel in which it is disposed, the twig structure is an interconnect structure that connects a trunk structure to instance item and the twig structure is oriented in a design to run perpendicular to the channel in which it is disposed; and wherein the channel is a region where the connections between trunk structures and twig structures are made.

31. An article of manufacture that includes a computer readable storage device that includes computer readable code to configure a computer to perform a method to produce constraint information for use by a routing process to generate routing signal lines in an integrated circuit design, the method comprising:

receiving by a computer, instructions to assemble multiple constituent graphical display objects on a display screen to produce a graphical net topology pattern display that represents a logical net that is associated within the storage device with at least two instance item structures of at least one functional design structure stored in the storage device, wherein the net topology pattern display shows connections between one or more of its constituent graphical display objects and at least two instance item display objects shown on a display screen that represent the at least two instance item structures stored in the storage device;

in response to the assembling of the topology pattern display on the display screen, producing a net topology pattern structure stored in the device that is associated in the storage device with the at least two instance item structures and that includes multiple constituent structures that indicate at least one constraint upon physical implementation of the logical net structure;

wherein the multiple constituent structures include a trunk structure that is associated in the device with attribute information that includes a net the trunk structure applies to, a constraint group specifying rules for the trunk structure, and a constraint group specifying default rules for twigs attached to the trunk structure wherein the trunk structure is an interconnect structure that is oriented in a design to run parallel to a channel in which it is disposed, the twig structure is an interconnect structure that connects a trunk structure to instance item and the twig structure is oriented in a design to run perpendicular to the channel in which it is disposed; and wherein the channel is a region where the connections between trunk structures and twig structures are made.

32. The article of claim 31 further including:

automatically adjusting a display of one or more constituent display objects that connect with one or more of the at least two instance item display objects on the display screen to stay connected in response to a change in location or size of the one or more of the at least two instance item display objects on the display screen.

33. The article of claim 31 further including:

receiving input to the computer that indicates attribute information associated with respective constituent display objects of the graphical net topology pattern display; and associating the received input in the device with respective corresponding constituent structures.

34. The article of claim 31, wherein the multiple constituent display objects include a trunk display object that corresponds to the trunk structure;

wherein the multiple constituent display objects include a twig display object that connects the trunk display object with at least one of the at least two instance item display objects;

wherein the multiple constituent structures includes a trunk structure that is associated in the device with attribute information that indicates a physical position of the trunk structure relative to the at least one instance item structures; and wherein the multiple constituent structures include a twig structure that indicates a physical connection between the trunk structure and the at least one of the instance item structures.

35. A system, comprising:

a storage device encoded with information representative of a device design; and a computing device in communication with the storage device, the computing device configured to perform a method to produce constraint information for use by a routing process to generate routing signal lines in an integrated circuit design, the method comprising, producing a net topology pattern structure stored in the storage device that corresponds to a logical net that is associated in the storage device with at least two instance item structures of at least one functional design structure stored in the storage device, wherein the net topology pattern structure is associated in the storage device with the at least two instance item structures and includes multiple constituent structures that indicate at least one constraint upon physical implementation of the logical net structure;

wherein the multiple constituent structures include a trunk structure that is associated in the device with attribute information that includes a net the trunk structure applies to, a constraint group specifying rules for the trunk structure, and a constraint group specifying default rules for twigs attached to the trunk structure wherein the trunk structure is an interconnect structure that is oriented in a design to run parallel to a channel in which it is disposed, the twig structure is an interconnect structure that connects a trunk structure to instance item and the twig structure is oriented in a design to run perpendicular to the channel in which it is disposed; and wherein the channel is a region where the connections between trunk structures and twig structures are made.

36. The system of claim 35, wherein the multiple constituent structures include a trunk structure that is associated in the device with attribute information that indicates a physical position of the trunk structure relative to the at least one or more instance item structures.

37. The system of claim 35, wherein producing the net topology pattern structure includes receiving by a computer instructions to assemble multiple constituent display objects on a display screen that correspond to the multiple constituent structures to produce a graphical net topology pattern display on the display screen.

38. The article of claim 37 further including:

displaying on the display screen at least two instance item display objects that correspond to the at least two instance item structures of the at least one functional design structure;

wherein the topology pattern display includes one or more constituent display objects that connect with the at least two instance item display objects on the display screen.

39. A system, comprising:

a storage device encoded with information representative of a device design; and a computing device in communication with the storage device, the computing device configured to perform a method to produce constraint information for use by a routing process to generate routing signal lines in an integrated circuit design, the method comprising, receiving by a computer, instructions to assemble multiple constituent graphical display objects on a display screen to produce a graphical net topology pattern display that represents a logical net that is associated within the storage device with at least two instance item structures of at least one functional design structure stored in the storage device, wherein the net topology pattern display shows connections between one or more of its constituent graphical display objects and at least two instance item display objects shown on a display screen that represent the at least two instance item structures stored in the storage device;

in response to the assembling of the topology pattern display on the display screen, producing a net topology pattern structure stored in the device that is associated in the storage device with the at least two instance item structures and that includes multiple constituent structures that indicate at least one constraint upon physical implementation of the logical net structure;

wherein the multiple constituent structures include a trunk structure that is associated in the device with attribute information that includes a net the trunk structure applies to, a constraint group specifying rules for the trunk structure, and a constraint group specifying default rules for twigs attached to the trunk structure wherein the trunk structure is an interconnect structure that is oriented in a design to run parallel to a channel in which it is disposed, the twig structure is an interconnect structure that connects a trunk structure to instance item and the twig structure is oriented in a design to run perpendicular to the channel in which it is disposed; and wherein the channel is a region where the connections between trunk structures and twig structures are made.

40. The system of claim 39 further including:
automatically adjusting a display of one or more constituent display objects that connect with one or more of the at least two instance item display objects on the display screen to stay connected in response to a change in location or size of the one or more of the at least two instance item display objects on the display screen.

41. The system of claim 39 further including:
receiving input to the computer that indicates attribute information associated with respective constituent display objects of the graphical net topology pattern display; and associating the received input in the device with respective corresponding constituent structures.

* * * * *